United States Patent
Kim et al.

(10) Patent No.: US 9,349,684 B2
(45) Date of Patent: May 24, 2016

(54) SEMICONDUCTOR PACKAGE AND ELECTRONIC APPARATUS INCLUDING THE SAME

(71) Applicants: Hyuk-su Kim, Daejeon (KR); Tae-ho Kang, Seoul (KR); Tae-hee Song, Gunpo-si (KR); Won-cheol Lee, Seoul (KR)

(72) Inventors: Hyuk-su Kim, Daejeon (KR); Tae-ho Kang, Seoul (KR); Tae-hee Song, Gunpo-si (KR); Won-cheol Lee, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 14/810,430

(22) Filed: Jul. 27, 2015

(65) Prior Publication Data
US 2016/0056091 A1      Feb. 25, 2016

(51) Int. Cl.
| H01L 23/498 | (2006.01) |
| H01L 27/088 | (2006.01) |
| H05K 1/02 | (2006.01) |
| H01L 23/31 | (2006.01) |
| H01L 25/065 | (2006.01) |
| H01L 23/04 | (2006.01) |

(52) U.S. Cl.
CPC ............ *H01L 23/4985* (2013.01); *H01L 23/04* (2013.01); *H01L 23/3121* (2013.01); *H01L 23/49844* (2013.01); *H01L 25/0655* (2013.01); *H01L 27/088* (2013.01); *H05K 1/0281* (2013.01)

(58) Field of Classification Search
CPC . H01L 23/4985; H01L 23/04; H01L 23/3121; H01L 23/49844; H01L 25/0655; H01L 27/088; H05K 1/0281
USPC .......................................................... 257/368
See application file for complete search history.

(56) References Cited

U.S. PATENT DOCUMENTS

| 6,051,877 | A | 4/2000 | Usami et al. |
| 6,392,143 | B1 | 5/2002 | Koshio |
| 6,633,078 | B2 * | 10/2003 | Hamaguchi ............. H01L 23/13 257/686 |
| 8,053,284 | B2 | 11/2011 | Iruvanti et al. |
| 8,107,248 | B2 * | 1/2012 | Shin ....................... G01L 19/146 174/254 |
| 8,232,642 | B2 * | 7/2012 | Kim ........................ H05K 3/3436 257/737 |
| 8,314,487 | B2 * | 11/2012 | Mohammed .............. B21D 22/20 257/723 |
| 2011/0132643 | A1 * | 6/2011 | Hattori ....................... C22F 1/08 174/254 |

FOREIGN PATENT DOCUMENTS

| JP | 3879823 | 2/2007 |
| JP | 2008-028011 | 2/2008 |
| JP | 2009-071185 | 4/2009 |
| KR | 10-1999-0030681 | 7/1999 |
| KR | 10-2003-0017677 | 3/2003 |

\* cited by examiner

*Primary Examiner* — Karen Kusumakar
*Assistant Examiner* — Adam S Bowen
(74) *Attorney, Agent, or Firm* — Muir Patent Law, PLLC

(57) ABSTRACT

Provided are a curved semiconductor package, and a device including the semiconductor package. The semiconductor package includes: a flexible printed circuit board (PCB) including a fixed bent portion formed as an arch-shape and including a first surface facing a first direction and a second surface opposite to the first surface; at least one semiconductor chip attached to the second surface of the fixed bent portion of the flexible PCB; and a mold layer having rigidity and formed on the second surface of the fixed bending portion of the flexible PCB while surrounding the at least one semiconductor chip.

20 Claims, 31 Drawing Sheets

SEMICONDUCTOR PACKAGE AND ELECTRONIC APPARATUS INCLUDING THE SAME

CROSS-REFERENCE TO RELATED APPLICATIONS

This application claims the benefit of Korean Patent Application No. 10-2014-0113353, filed on Aug. 28, 2014, in the Korean Intellectual Property Office, the disclosure of which is incorporated herein in its entirety by reference.

BACKGROUND

The present disclosure relates to a semiconductor package and an electronic device including the semiconductor package, and more particularly, to a semiconductor package that is curved and an electronic device including the semiconductor package.

According to rapid development in electronic industries and demands of users, electronic devices are being miniaturized and wearable devices of various types have been developed. Therefore, a semiconductor package having a curved surface or a flexible semiconductor package has been developed in order to be mounted on electronic devices having a curved surface. However, as a result of having a curved surface or as a result of using a flexible semiconductor package, a volume of the above semiconductor package is often increased or reliability of the semiconductor package is degraded.

SUMMARY

Various aspects of the inventive concept provide a curved semiconductor package having a reduced volume and improved reliability and performance, and an electronic device formed using the curved semiconductor package.

According to an aspect of the inventive concept, an electronic device includes: a flexible printed circuit board (PCB) of a semiconductor package, including a fixed bent portion in a fixed state and formed in an arch-shape and comprising a first concave surface and a second convex surface opposite to the first surface; at least one semiconductor chip attached to the second surface of the fixed bending portion of the flexible PCB and forming an arch-shape; and a mold layer having rigidity and formed on the second surface of the fixed bent portion of the flexible PCB while surrounding the at least one semiconductor chip.

The flexible PCB may further include a flexible portion extending from the fixed bent portion, and at least a part of the flexible portion is not covered by the mold layer.

The flexible PCB may be continually formed from the fixed bent portion to the flexible portion.

The mold layer may cause the flexible PCB to be in the fixed state at the fixed bent portion.

The flexible PCB may include a base package substrate, a plurality of wiring lines, and a cover layer formed at the first surface and the second surface to cover at least a part of the plurality of wiring lines, and the cover layer may cover the entire first surface of the fixed bending portion.

At least one of the plurality of wiring lines may not be electrically connected to the at least one semiconductor chip.

The electronic device may further include at least one additional semiconductor chip attached to the second surface of the flexible portion and electrically connected to at least one of the plurality of wiring lines.

The flexible PCB may further include an external connection portion formed on a first end of the flexible portion, which is farther from the fixed bent portion than is a second end of the flexible portion.

The flexible PCB may further include an electromagnetic interference (EMI) pad disposed on the second surface of the flexible portion and electrically connected to a ground wiring line from among the plurality of wiring lines, and the semiconductor package may further include an EMI shielding layer connected to the EMI pad and covering a surface of the mold layer.

The at least one semiconductor chip may include a plurality of metal oxide semiconductor field effect transistor (MOSFET) devices, an active surface on which a plurality of word lines and a plurality of bit lines extending perpendicularly to each other to form the plurality of MOSFET devices are formed, and a non-active surface opposite to the active surface, and the at least one semiconductor chip may be attached to the fixed bent portion so that the non-active surface of the at least one semiconductor chip faces the second surface.

The plurality of MOSFET devices may be n-type MOSFET devices, and the plurality of bit lines may extend along an arc direction, in which the fixed bent portion extends.

The plurality of MOSFET devices may be p-type MOSFET devices, and the plurality of word lines may extend along an arc direction, in which the fixed bent portion extends.

The at least one semiconductor chip may be electrically connected to the flexible PCB via a bonding wire.

The at least one semiconductor chip may include a plurality of MOSFET devices, an active surface on which a plurality of word lines and a plurality of bit lines extending perpendicularly to each other to form the plurality of MOSFET devices are formed, and a non-active surface opposite to the active surface, and the at least one semiconductor chip is attached to the fixed bent portion so that the active surface thereof faces the second surface.

The plurality of MOSFET devices may be n-type MOSFET devices, and the plurality of word lines may extend in an arc direction, in which the fixed bent portion extends.

The plurality of MOSFET devices may be p-type MOSFET devices, and the plurality of bit lines may extend in an arc direction, in which the fixed bent portion extends.

The at least one semiconductor chip may be electrically connected to the flexible PCB via a connection bump.

The electronic device may further include a curved outer housing in which the semiconductor package is disposed.

In one embodiment, the first surface of the first fixed bent portion of the flexible PCB extends along an arc, and faces a center of curvature to have a first radius of curvature; and an upper surface of the mold layer extends along an arc having a second radius of curvature, and a center of curvature of the arc having the second radius of curvature is farther from the fixed bent portion than is a center of curvature of the arc having the first radius of curvature.

According to one aspect of the inventive concept, a semiconductor package includes: a flexible printed circuit board (PCB) including a fixed bent portion formed as an arch-shape extending along an arc having a first radius of curvature, a flexible portion extending from the fixed bending portion, and a first surface facing a center of curvature and a second surface opposite to the first surface; at least one semiconductor chip attached to the second surface of the fixed bent portion of the flexible PCB, and formed as an arch-shape extending along the arc having the first radius of curvature; and a mold layer having rigidity and covering the entire second surface of the fixed bent portion of the flexible PCB while surrounding the at least one semiconductor chip.

An upper surface of the mold layer may extend along an arc having a second radius of curvature, and a center of curvature of the arc having the second radius of curvature may be farther from the fixed bent portion than is a center of curvature of the arc having the first radius of curvature.

An upper surface of the mold layer may extend along an arc having a second radius of curvature that is less than the first radius of curvature.

A plurality of the semiconductor chips may be sequentially stacked, and an uppermost semiconductor chip from among the plurality of semiconductor chips may have an area that is less than an area of another semiconductor chip located under the uppermost semiconductor chip.

The at least one semiconductor chip may include a plurality of metal oxide semiconductor field effect transistor (MOSFET) devices, and mobility in the plurality of MOSFET devices when the at least one semiconductor chip is arch-shaped is greater than mobility in the plurality of MOSFET devices when the at least one semiconductor chip is flat.

The plurality of MOSFET devices may include n-type MOSFET devices, and the at least one semiconductor chip may be attached to the fixed bending portion of the flexible PCB so that a tensile strain is applied in a channel direction of the n-type MOSFET devices.

The plurality of MOSFET devices may include p-type MOSFET devices, and the at least one semiconductor chip may be attached to the fixed bending portion of the flexible PCB so that a compressive strain is applied in a channel direction of the p-type MOSFET devices.

The flexible portion may extend along a curved surface continued from the fixed bending portion.

The flexible portion may have a flat shape.

The fixed bending portion and the at least one semiconductor chip may be fixed by the mold layer so that deformation is restricted.

The flexible portion may freely transform.

The flexible PCB may further include: an insulating cover layer covering the entire surface of the fixed bending portion; and an external connection portion formed on the flexible portion.

The flexible PCB may further include a plurality of wiring lines electrically connected to the external connection portion, an additional connection portion may be formed on the flexible portion or at least one additional semiconductor chip is attached to the flexible portion, at least some of the plurality of wiring lines are electrically connected to the at least one semiconductor chip, and at least one of the plurality of wiring lines is not electrically connected to the at least one semiconductor chip, but is electrically connected to the additional connection portion or the at least one additional semiconductor chip.

The at least one semiconductor chip may include a plurality of dynamic random access memory (DRAM) semiconductor chips.

According to an aspect of the inventive concept, an electronic device has an outer appearance including a curved surface. The electronic device includes: a semiconductor package including: a flexible printed circuit board (PCB) including a fixed bent portion in a fixed state and formed in an arch-shape extending along an arc having a concave curvature facing a first direction, and a flexible portion extending from the fixed bent portion. The flexible PCB includes a first surface facing the first direction and a second surface opposite to the first surface. At least one semiconductor chip is attached to the second surface of the fixed bent portion of the flexible PCB. The semiconductor package additionally includes a mold layer having rigidity and formed on the second surface of the fixed bent portion of the flexible PCB while surrounding the at least one semiconductor chip for restricting deformation of the fixed bent portion; and the electronic device additionally includes a system block connected to the flexible portion to be electrically connected to the semiconductor package. The at least one semiconductor package may be provided in the electronic device so that the fixed bent portion corresponds to the outer appearance including the curved surface of the electronic device.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION

Figure 1:
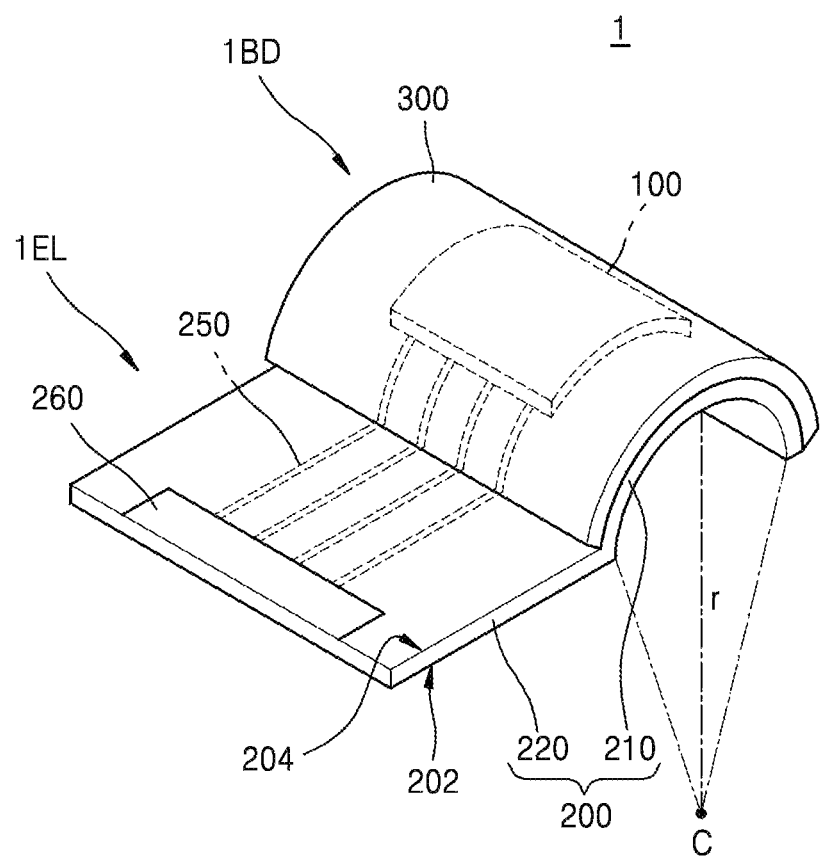
FIG. 1 is a perspective view of a semiconductor package according to an exemplary embodiment of the inventive concept.

Various aspects of the inventive concept will now be described more fully with reference to the accompanying drawings, in which exemplary embodiments of the inventive concept are shown. The inventive concept may, however, be embodied in many different forms and should not be construed as being limited to the embodiments set forth herein. In the drawings, lengths and sizes of components may be exaggerated for convenience of explanation, and a ratio between the sizes of components may be enlarged or reduced.

It will be understood that when a component is referred to as being "on," "coupled to," or "connected to" another component, the component can be directly on or directly connected to or coupled to another component or intervening components may be present. In contrast, when a component is referred to as being "directly on" another component or "directly connected to" or "directly coupled to" another element, there are no intervening components present. Other expressions describing relationships between components, such as, "between" and "directly between", will also be similarly understood. However, the term "contact," as used herein refers to direct contact (i.e., touching) unless the context indicates otherwise.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present disclosure. In addition, in certain cases, even if a term is not described using "first," "second," etc., in the specification, it may still be referred to as "first" or "second" in a claim in order to distinguish different claimed elements from each other.

As used herein, the singular forms "a," "an" and "the" are intended to include the plural forms as well, unless the context clearly indicates otherwise. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may added.

Unless otherwise defined, all terms used herein have a meaning consistent with their usage as commonly understood by one of ordinary skill in the art to which this disclosure belongs.

Embodiments described herein will be described referring to plan views and/or cross-sectional views by way of ideal schematic views. Accordingly, the exemplary views may be modified depending on manufacturing technologies and/or tolerances. Therefore, the disclosed embodiments are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Various aspects of the inventive concept will now be described more fully with reference to the accompanying drawings, in which exemplary embodiments of the inventive concept are shown. As used herein, the term "and/or" includes any and all combinations of one or more of the associated listed items. Expressions such as "at least one of," when preceding a list of elements, modify the entire list of elements and do not modify the individual elements of the list.

FIG. 1 is a perspective view of a semiconductor package 1 according to an exemplary embodiment of the inventive concept.

Referring to FIG. 1, the semiconductor package 1 includes at least one semiconductor chip 100, a flexible printed circuit board (PCB) 200, and a mold layer 300.

The semiconductor chip 100 may include a semiconductor device formed on, for example, a semiconductor substrate. The semiconductor substrate may include, for example, silicon (Si). Otherwise, the semiconductor substrate may include semiconductor element such as germanium (Ge), or compound semiconductor such as silicon carbide (SiC), gallium arsenide (GaAs), indium arsenide (InAs) and indium phosphate (InP). In other embodiments, the semiconductor substrate may have a silicon on insulator (SOI) structure. For example, the semiconductor substrate may have a buried oxide (BOX) layer. Also, the semiconductor substrate may have various device isolation structures such as a shallow trench isolation (STI) structure.

The semiconductor device may include a system large scale integration (LSI), a flash memory, a dynamic random access memory (DRAM), a static RAM (SRAM), an electrically erasable and programmable read only memory (EEPROM), a parameter RAM (PRAM), a magnetic RAM (MRAM), or a resistive RAM (RRAM). The semiconductor device may include a plurality of individual devices of various kinds. The plurality of individual devices may include various microelectronic devices, for example, a metal-oxide-semiconductor field effect transistor (MOSFET) such as a complementary metal-insulator-semiconductor (CMOS) transistor, a system LSI, an image sensor such as a CMOS imaging sensor (CIS), a micro-electro-mechanical system (MEMS), an active device, or a passive device. It should be noted that the term "semiconductor device" as used here may refer to all or part of an integrated circuit that forms one of these above devices. More generally, the term "semiconductor device" may refer to a semiconductor chip formed on a die, a stack of semiconductor chips, a semiconductor package including a chip formed on a package substrate, or a package-on-package device. A semiconductor device that includes memory cells may be a semiconductor memory device, and a semiconductor device that includes logic cells may be a semiconductor logic device, such as a controller, or microprocessor. An "electronic device" may generally refer to one of these semiconductor devices, and may also refer to other devices, such as a memory module, memory card, a hard drive including additional components, or a mobile phone, laptop, tablet, desktop, camera, or other consumer electronic device, etc.

The semiconductor device may include a conductive region formed in the semiconductor substrate, for example, a well doped with impurities, or a structure doped with impurities. The plurality of individual devices may be electrically connected to the conductive region formed in the semiconductor substrate. The semiconductor device may further include a conductive wire or a conductive plug for connecting at least two selected from the plurality of individual devices, or the plurality of individual devices and the conductive region in the semiconductor substrate electrically. Also, each of the plurality of individual devices may be electrically isolated from the other individual devices by insulating layers.

The semiconductor device may include wiring structures for electrically connecting the plurality of individual devices to pads. The wiring structures may include, for example, a metal wiring layer and a via plug. The metal wiring layer and the via plug may be formed of a barrier layer for wiring and a metal layer for wiring. The barrier layer for wiring may include at least one material selected from Ti, TiN, Ta, and TaN. The metal layer for wiring may include at least one metal selected from W, Al, and Cu. The metal wiring layer and the via plug may be formed of the same material as each other. Alternatively, at least some of the metal wiring layer and the via plug may include different materials from each other. The metal wiring layer and/or the via plug may be formed to have a multi-layered structure. For example, the wiring structure may be a multi-layered structure, in which two or more metal wiring layers or two or more via plugs are alternately stacked. A passivation layer for protecting the semiconductor device against external shock or moisture may be formed on the semiconductor device, and the pad may be exposed to outside by the passivation layer.

In FIG. 1, one semiconductor chip 100 is shown, but the semiconductor package 1 is not limited thereto. For example, the semiconductor package 1 may include a plurality of semiconductor chips 100, for example stacked on each other or side by side. A case in which the plurality of semiconductor chips 100 are provided will be described below with reference to FIGS. 7 through 12.

The flexible PCB 200 may include a substrate, such as an insulating base substrate, a conductive wiring pattern, and a cover layer covering a surface of the flexible PCB. One example of the flexible PCB 200 will be described below with reference to FIG. 7.

In one embodiment, the flexible PCB 200, as part of the semiconductor package 1 includes a fixed bending portion 210 and a flexible portion 220. The flexible portion 220 may extend from the fixed bending portion 210 in a direction. In one embodiment, the fixed bending portion 210 is a portion that is fixed by a rigid mold layer 300, and the flexible portion 220 is a soft portion. For example, the entire PCB may be formed to be flexible (e.g., able to bend under its own weight and/or under manual manipulation, as opposed to a rigid material that does not bend by such manipulation), but the fixed bending portion 210 may be in a fixed bent position, for example being fixed by another layer such as a rigid, inflexible mold layer, while the flexible portion 220 may not be so constrained. Therefore, the fixed bending portion 210 may also be referred to herein as a fixed bent portion or rigid bent portion, and the flexible portion 200 may also be referred to herein as a bendable portion. These terms may also be used to describe different portions of the semiconductor package 1 (e.g., wherein the portion of the semiconductor package including the mold layer 300 and part of the flexible PCB (e.g., part 210) is the rigid bent portion, and the portion of the semiconductor package including the other part of the flexible PCB (e.g., part 220) is referred to a flexible portion or bendable portion.

Thus, the fixed state of the fixed bending portion 210 due to the mold layer 300 does not denote that the fixed bending portion 210 of the actual PCB is not flexible, but denotes that the fixed bending portion 210 as covered by the mold layer 300 is rigid so that deformation is restricted and the curved shape is fixed. Since at least a part of the PCB 200, for example, the flexible portion 220, is not covered by the mold layer 300, the flexible portion 220 may freely deform due to the flexibility of the flexible PCB 200.

Also, at least one semiconductor chip 100 disposed between the fixed bending portion 210 and the mold layer 300 is fixed by the mold layer 300 so as not to deform.

For example, in one embodiment, the fixed bending portion 210 and the flexible portion 220 of the flexible PCB 200 are not separately formed or are not formed of materials having different physical properties. It may be formed of a single board being continually formed throughout, but portions may be distinguished based whether, as part of the semiconductor package (e.g., 1), the bending and deformation thereof is restricted or not.

In one exemplary embodiment, the fixed bending portion 210 may have an arch shape that extends along an arc having a predetermined radius of curvature r. The bending portion 210 may thus have a first, concave surface facing a first direction (e.g., the bottom surface depicted in FIG. 1 facing a downward direction), and a second, convex surface opposite the first surface (e.g., the top surface depicted in FIG. 1). The radius of curvature r may be, for example, 10 mm to 50 mm. In the flexible PCB 200, a surface facing a center of curvature of the fixed bending portion 210 may be referred to as a first surface 202 and an opposite surface may be referred to as a second surface 204. Here, the radius of curvature of the arc extending from the first surface 202 and the radius of curvature of the arc extending from the second surface 202 may be different from each other by about a thickness of the flexible CB 200; however, if the flexible PCB 200 is small in thickness, the arcs extending from the first and second surfaces 202 and 204 may have the radiuses of curvature that are nearly the same as each other.

At least one semiconductor chip 100 may be attached to the second surface of the fixed bending portion 210 of the flexible PCB 200. The at least one semiconductor chip 100 may have, for example, an arch shape having a constant radius of curvature along with the second surface 204 of the fixed bending portion 202 having the radius of curvature r. Since the at least one semiconductor chip 100 is attached to the second surface 204 along the curvature of the second surface 204 of the fixed bending portion 210, the semiconductor chip 100 may have the same center of curvature C as the fixed bending portion 210. In addition, the at least one semiconductor chip 100 may have the radius of curvature that is nearly the same as that of the flexible PCB 200 because the at least one semiconductor chip 100 is very small in thickness.

As will be described later, the at least one semiconductor chip 100 has the arch shape, and thus, electron mobility in the semiconductor device included in the at least one semiconductor chip 100 may be greater than that of the flat semiconductor chip due to a strain effect. Therefore, performance of the semiconductor package 1 including the at least one semiconductor chip 100 may be improved. Though an arch shape having a constant radius of curvature is disclosed, the shape need not be formed as such. Generally the shape of the different components at the fixed bent portion 210 of the flexible PCB 200 may be a curved shape, or bent shape. It can have a constant radius of curvature, or can have varied curvature.

In FIG. 1, the radius of curvature r based on the first surface 202 of the flexible PCB 200 is shown; however, if it is assumed that the thickness of the flexible PCB 200 and the semiconductor chip 100 is relatively thin when comparing with the radius of curvature r, the radius of curvature of the semiconductor chip 100 is nearly the same as the radius of curvature r. Thus, the radius of curvature of the semiconductor chip 100 is omitted, as in one embodiment, it may be substantially the same as the radius of curvature of surface 202 of the fixed bending portion 210 of the flexible PCB 200.

A plurality of wiring lines 250 are formed in the flexible PCB 200. The plurality of wiring lines 250 may denote the conductive wiring pattern that is described above.

The at least one semiconductor chip 100 may be electrically connected to at least some of the plurality of wiring lines 250. An external connection portion 260 that is electrically connected to the plurality of wiring lines 250 may be formed on an end of the flexible portion 220 of the flexible PCB 200. The external connection portion 260, also referred to as an external connection interface, may be formed on the end of the flexible portion 220, for example, at a far end from the fixed bending portion 210. The external connection portion 260 may include, for example, a set of terminals for communicating between the semiconductor package 201 and an external device. For example, each terminal of the external connection portion 260 may include a pad exposing a part of a respective wiring line of the plurality of wiring lines 250, a connector electrically connected to the pad and for connecting to an external device, or other types of components formed on the flexible portion 220 to be electrically connected to the external device. The external connection portion 260 may be formed on the first surface 202, the second surface 204, or both the first and second surfaces 202 and 204 of the flexible portion 220.

The mold layer 300 may be formed on the fixed bending portion 210 of the flexible PCB 200 while surrounding the at least one semiconductor chip 100. The mold layer 300 may be formed of a rigid material, for example, an epoxy molding compound (EMC). For example, the mold layer 300 may be formed of an encapsulant, also referred to as an encapsulation layer, that covers and protects the semiconductor chip 100, or multiple semiconductor chips when a plurality of semiconductor chips are used.

The semiconductor package 1 may include a main body 1BD and an extension wire portion 1EL. The main body 1BD, which may also be referred to as a rigid bent portion, as described above, and is also referred to as a chip portion or integrated circuit portion, denotes a portion including the fixed bending portion 210 of the flexible PCB 200, the at least one semiconductor chip 100 attached to the fixed bending portion 210, and the mold layer 300 having rigidity and covering the fixed bending portion 210. The extension wire portion 1EL, also referred to as a bendable portion, as described above, and referred to as a terminal portion, or connection portion, may denote a portion including the flexible portion 220 on which the plurality of wiring lines 250 extending from the main body 1BD are formed, and the external connection portion 260 formed on the flexible portion 220. In one embodiment, the deformation of the main body 1BD may be restricted, but the extension wire portion 1EL may be freely deformed.

The extension wire portion 1EL, for example, the flexible portion 220, may have a flat shape. For example, if the semiconductor package 1 is provided independently, such that no external forces are acting upon it, the extension wire portion 1EL may default to having a flat shape. In addition, the semiconductor package 1 may have a default position to have a bent region (which may be, for example, an angled corner) at the interface between the main body 1BD and the extension wire portion 1EL. The semiconductor device 1, in its default position, may thus have a scoop shape, or spoon shape, when viewed as a cross-section. However, if the semiconductor package 1 is installed in a system for configuring the semiconductor package 1, the extension wire portion 1EL may be deformed as needed. Thus, the extension wire portion 1EL may have a curved portion when in the system, depending on the system configuration.

For example, during manufacturing the semiconductor package 1, the fixed bending portion 1 may be fabricated as an arch shape extending along with an arc having a constant radius of curvature. However, the flexible portion 220 may not be processed to form a rigid curved portion, and thus may have the flat shape having flexibility.

Figure 2:
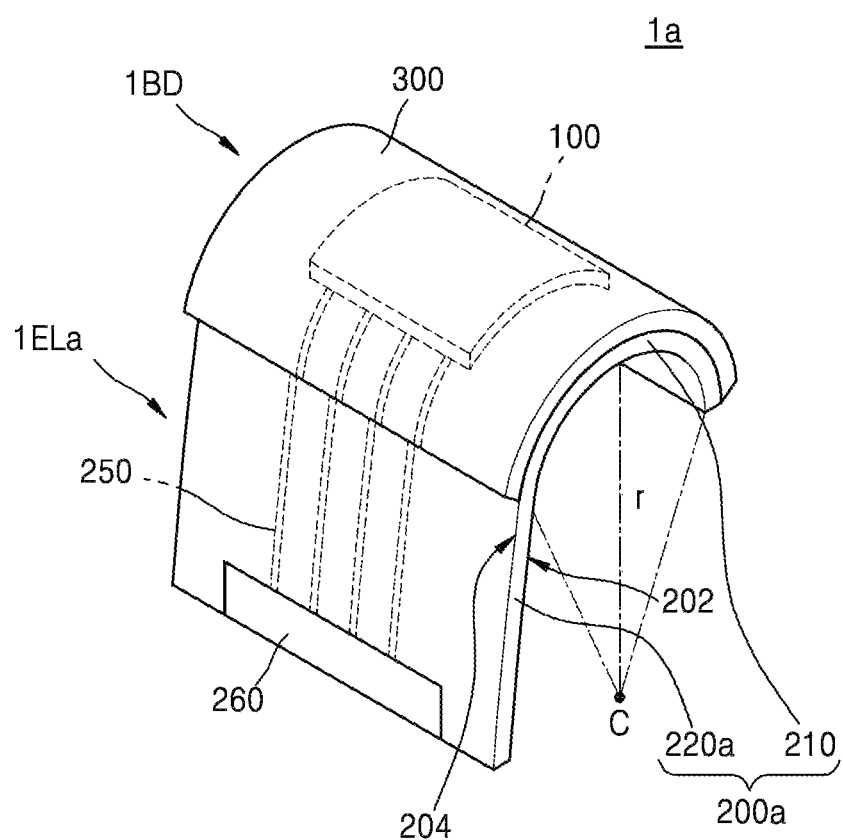
FIG. 2 is a perspective view of a semiconductor package according to an exemplary embodiment of the inventive concept.

FIG. 2 is a perspective view of a semiconductor package 1a according to an exemplary embodiment of the inventive concept. In FIG. 2, like reference numerals as those of FIG. 1 denote the same elements, and descriptions thereof may be omitted.

Referring to FIG. 2, the semiconductor package 1a may include at least one semiconductor chip 100, a flexible PCB 200a, and the mold layer 300.

In FIG. 2, one semiconductor chip 100 is provided, but the inventive concept is not limited thereto. For example, there may be a plurality of semiconductor chips 100. A case where the plurality of semiconductor chips 100 are provided will be described below with reference to FIGS. 7 through 12.

The flexible PCB 200a may include the fixed bending portion 210 and a flexible portion 220a.

The semiconductor package 1a may include the main body 1BD and an extension wire portion 1ELa. The main body 1BD denotes a portion including the fixed bending portion 210 of the flexible PCB 200a, and the mold layer 300 having rigidity and covering the at least one semiconductor chip 100 attached to the fixed bending portion 210 and the fixed bending portion 210. The extension wire portion 1ELa may denote a portion including the flexible portion 220a in which the plurality of wiring lines 250 extending from the main body 1BD are formed, and the external connection portion 260 formed on the flexible portion 220a. Deformation of the main body 1BD is restricted, but the extension wire portion 1ELa may be freely deformed.

The extension wire portion 1ELa, for example, the flexible portion 220a, may extend from the fixed bending portion 210 along a continuous surface from the fixed bending portion 210 without being bent. For example, in its default position, there may be no angled corner at the interface between the fixed bending portion 210 and the flexible portion 220a. For example, if the semiconductor package 1a is provided in a system, the extension wire portion 1ELa may be deformed if necessary, but may retain a shape such as shown in FIG. 2 when no external force is being applied. Thus, the extension wire portion 1ELa may have a bent portion when used in a system.

In one embodiment, when manufacturing the semiconductor package 1a, the fixed bending portion 210 is fabricated to have an arch shape extending along with the arc having a constant radius of curvature, and the flexible portion 220a may be processed with the fixed bending portion 210 to extend along with the continuous surface extending from the fixed bending portion 210. The semiconductor device 1a, in its default position, may thus have a "J" shape, when viewed as a cross-section.

Figure 3:
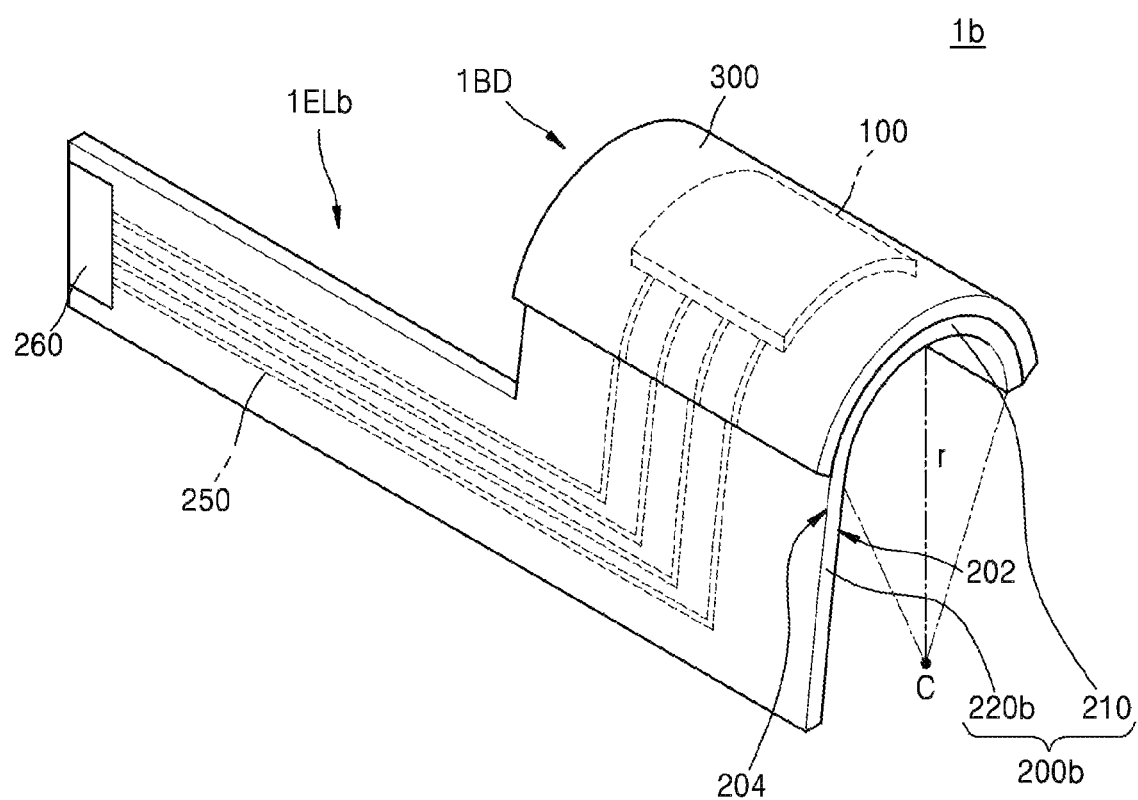
FIG. 3 is a perspective view of a semiconductor package according to an exemplary embodiment of the inventive concept.

FIG. 3 is a perspective view of a semiconductor package 1b according to another exemplary embodiment of the inventive concept. In FIG. 3, like reference numerals as those of FIG. 1 and FIG. 2 denote the same elements, and descriptions thereof may be omitted.

Referring to FIG. 3, the semiconductor package 1b may include at least one semiconductor chip 100, a flexible PCB 200b, and the mold layer 300.

Although one semiconductor chip 100 is provided in FIG. 3, the inventive concept is not limited thereto. For example, there may be a plurality of semiconductor chips 100. A case where the plurality of semiconductor chips 100 are provided will be described below with reference to FIGS. 7 through 12.

The flexible PCB 200b may include the fixed bending portion 210 and a flexible portion 220b. The flexible portion 220b of the flexible PCB 200b included in the semiconductor package 1b may extend from the fixed bending portion 210 in a direction, and then may extend further after changing direction. Also, a width of the flexible portion 220b may be changed when changing the extending direction (e.g., a width in a direction perpendicular to the wires 250).

The extension wire portion 1ELb, for example, the flexible portion 220b, may be processed in various shapes to be connected to other devices included in the system, in which the semiconductor package 1b is provided.

For example, during the manufacturing of the semiconductor package 1b, the flexible portion 220b is flexible and thus may be processed to have various curved, bent, twisted, etc., shapes as long as the plurality of wiring lines 250 exist.

In addition, FIGS. 1 through 3 show that the flexible portions 220, 220a, and 220b extend from the fixed bending portion 210 to have the same width as that of the fixed bending portion 210. However, the flexible portions 220, 220a, and 220b may have different widths from that of the fixed bending portion 210, or may have a variable width (e.g., a tapered width) while extending from the fixed bending portion 210.

Figure 4:
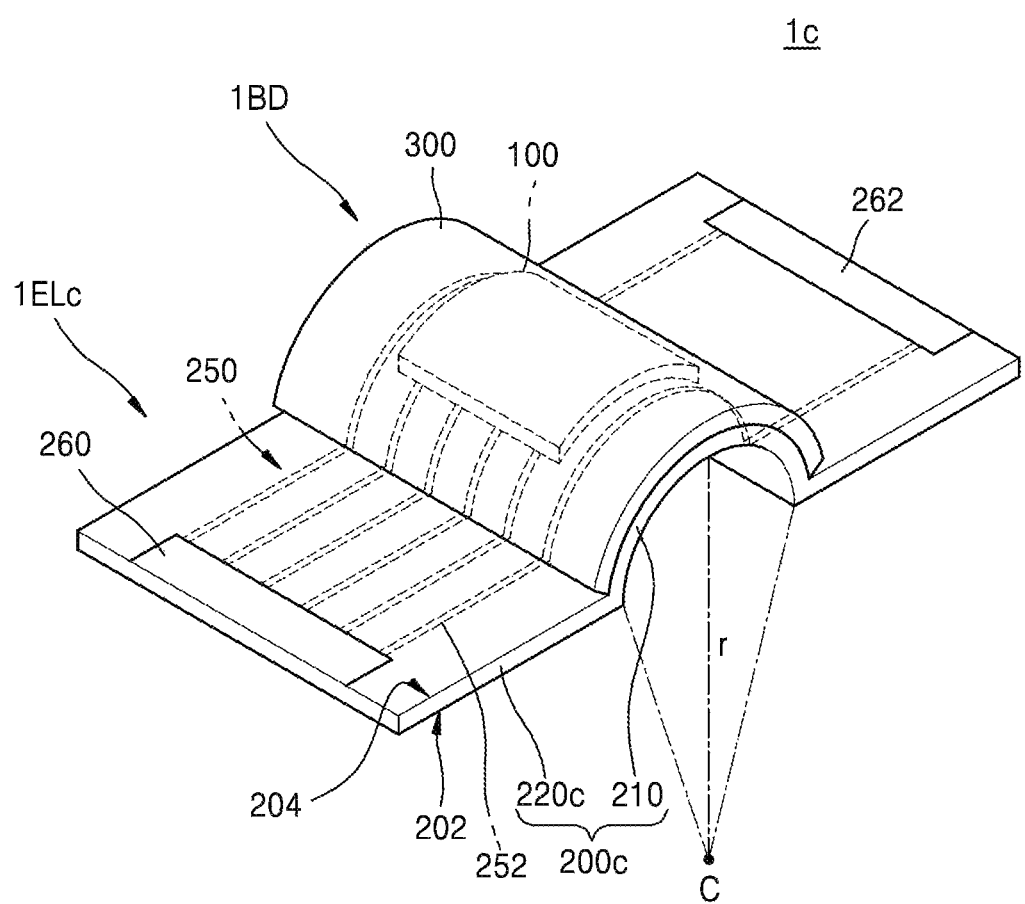
FIG. 4 is a perspective view of a semiconductor package according to an exemplary embodiment of the inventive concept.

FIG. 4 is a perspective view of a semiconductor package 1c according to another exemplary embodiment of the inventive concept. In FIG. 4, like reference numerals as those of FIGS. 1 through 3 denote the same elements, and descriptions thereof may be omitted.

Referring to FIG. 4, the semiconductor package 1c may include at least one semiconductor chip 100, a flexible PCB 200c, and the mold layer 300.

FIG. 4 shows one semiconductor chip 100; however, one or more embodiments of the inventive concept are not limited thereto. For example, there may be a plurality of semiconductor chips 100 on the fixed bent portion 210 of the flexible portion 220c. A case in which the plurality of semiconductor chips 100 are provided will be described below with reference to FIGS. 7 through 12.

The semiconductor package 1c may include the main body 1BD and an extension wire portion 1ELc. The flexible PCB 200c may include the fixed bending portion 210 and a flexible portion 220c. The flexible portion 220c of the flexible PCB 200c included in the semiconductor package 1c may include two flexible sub-portions that extend from the fixed bending portion 210 in opposite directions.

The plurality of wiring lines 250 may be formed in the flexible PCB 200c. The at least one semiconductor chip 100 may be electrically connected to at least some of the plurality of wiring lines 250. The external connection portion 260 may be formed on an end of the flexible portion 220c of the flexible PCB 200c, and an additional connection portion 262 may be formed on an opposite end of the flexible portion 220c.

In one embodiment, such as shown in FIG. 4, at least one additional wiring line 252 from among the plurality of wiring lines 250 is not electrically connected to the at least one semiconductor chip 100. The additional wiring line 252 may electrically connect the external connection portion 260 and the additional connection portion 262 that are formed on one ends of the flexible portions 220c that extend from the fixed bending portion 210 in opposite directions. An external device connected to the external connection portion 260 and another external device connected to the additional connection portion 262 may be electrically connected to each other via the additional wiring line 252, for example, without passing through any semiconductor chips.

Since the external devices may be electrically connected to each other via the semiconductor package 1c within the system in which the semiconductor package 1c is provided, connecting wires in the system, in which the semiconductor package 1c is provided, may be reduced. Therefore, a size of the system in which the semiconductor package 1c is provided may be reduced.

Figure 5:
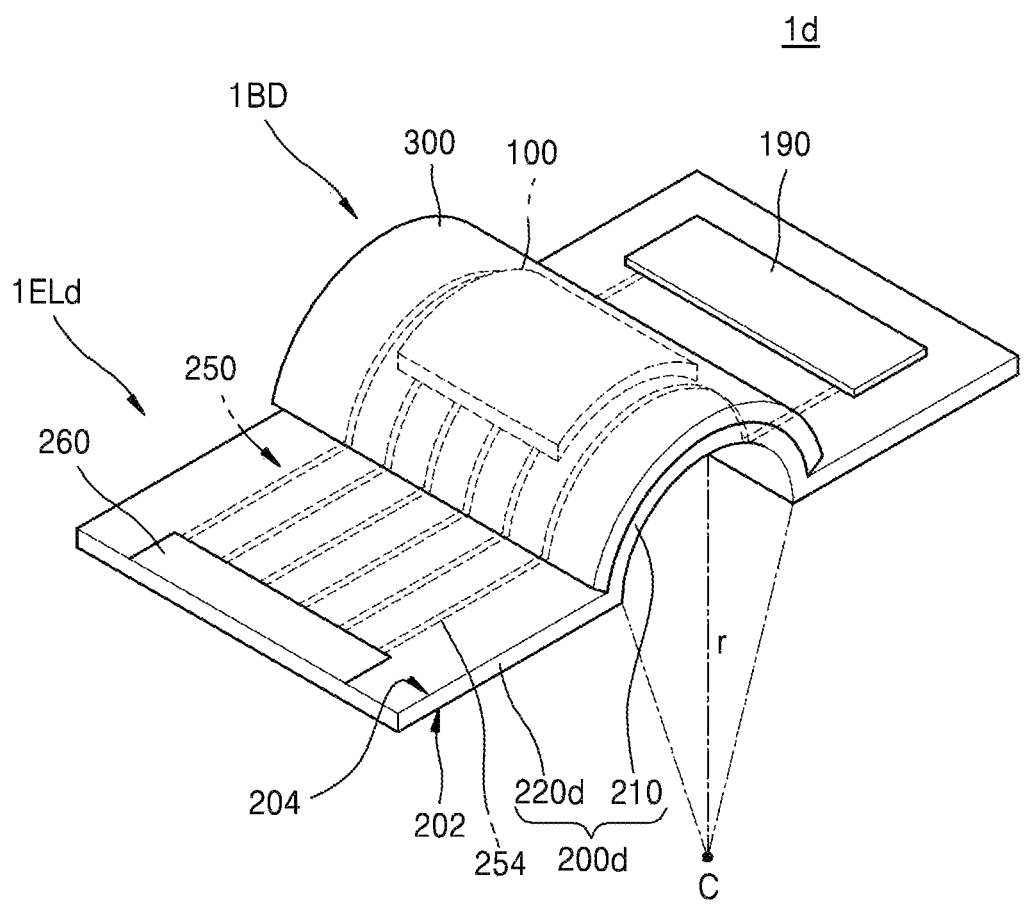
FIG. 5 is a perspective view of a semiconductor package according to an exemplary embodiment of the inventive concept.

FIG. 5 is a perspective view of a semiconductor package 1d according to another exemplary embodiment of the inventive concept. In FIG. 5, like reference numerals as those of FIGS. 1 through 4 denote the same elements, and descriptions thereof may be omitted.

Referring to FIG. 5, the semiconductor package 1d includes at least one semiconductor chip 100, a flexible PCB 200d, and the mold layer 300.

FIG. 5 shows one semiconductor chip 100; however, one or more embodiments of the inventive concept are not limited thereto. For example, there may be a plurality of semiconductor chips 100. A case in which the plurality of semiconductor chips 100 are provided will be described below with reference to FIGS. 7 through 12.

The semiconductor package 1d may include main body 1BD and an extension wire portion 1ELd. The flexible PCB 200d may include the fixed bending portion 210 and a flexible portion 220d. The flexible portion 220d of the flexible PCB 200d included in the semiconductor package 1d may include two flexible sub-portions that extend from the fixed bending portion 210 in opposite directions.

The plurality of wiring lines 250 may be formed in the flexible PCB 200d. The at least one semiconductor chip 100 may be electrically connected to at least some of the plurality of wiring lines 250. The external connection portion 260 may be formed on an end of the flexible portion 220d of the flexible PCB 200d. At least one additional semiconductor chip 190 or semiconductor device (e.g., a stack of semiconductor chips or a semiconductor package) may be attached to the second surface 204 of the flexible portion 220d in the flexible PCB 200d.

In FIG. 5, the at least one additional semiconductor chip 190 is attached to a portion of the flexible portion 220d extending from the fixed bending portion 210 in the opposite directions, wherein the portion is opposite to the portion to which the external connection portion 260 is connected, but it is not limited thereto. For example, the at least one additional semiconductor chip 190 may be attached to the second surface 204 of the flexible portion 220 shown in FIG. 1 (e.g., to the same sub-portion of the semiconductor package 1d as the external connection portion 260.

In one embodiment, such as shown in FIG. 5, at least one additional wiring line 254 from among the plurality of wiring lines 250 is not electrically connected to the at least one semiconductor chip 100. The additional wiring line 254 may electrically connect the external connection portion 260 and the additional semiconductor chip 190 to each other.

In one embodiment, FIG. 5 depicts an example where at least one additional semiconductor chip (e.g., 190) is needed for the semiconductor package 1d. In this case, because the at least one additional semiconductor chip 190 may be electrically connected to an external device in the system via the semiconductor package 1d, connection wires in the system in which the semiconductor package 1d is provided may be reduced. Accordingly, the size of the system in which the semiconductor package 1d is provided may be reduced.

In FIGS. 4 and 5, the flexible portion 220c and 220d are flat, and are shown to have a flat default shape that includes an angled portion between the main body 1BD and the extension wire portion 1ELc and 1ELd but they are not limited thereto. For example, one or both sub-portions of the flexible portions 220c and 220d may have the similar shape to the flexible portions 220a and 220b shown in FIGS. 2 and 3, and may extend from the fixed bending portion 210 without an angle in the default position.

Figure 6:
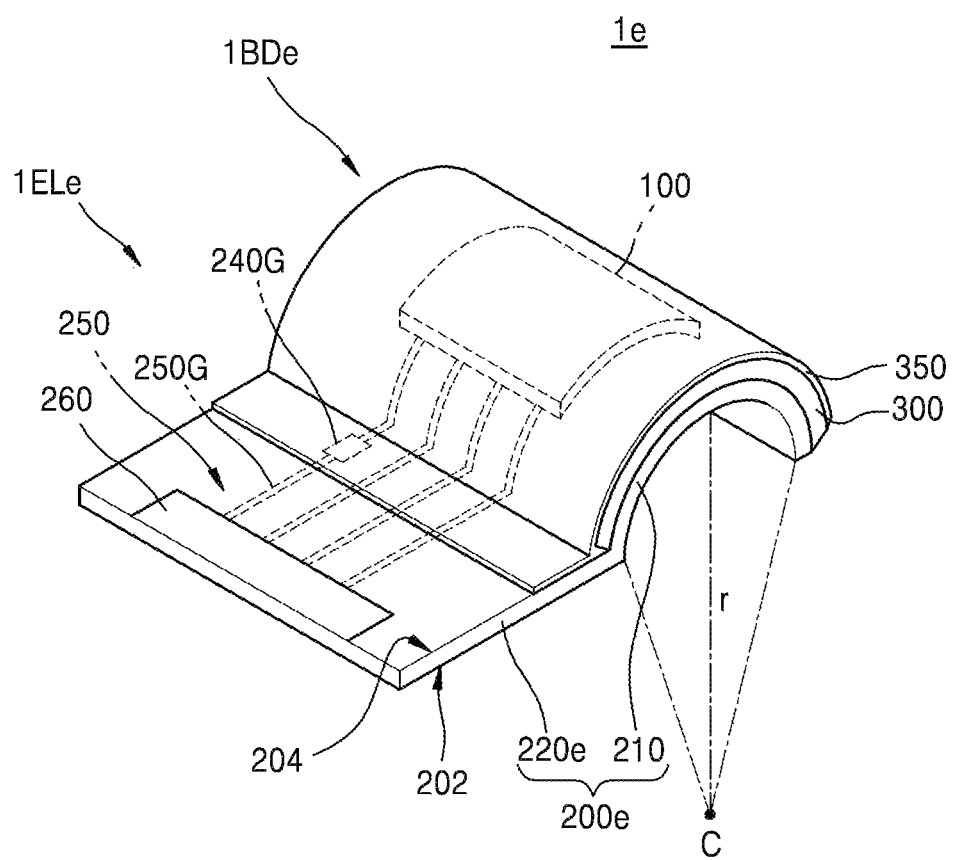
FIG. 6 is a perspective view of a semiconductor package according to an exemplary embodiment of the inventive concept.

FIG. 6 is a perspective view of a semiconductor package 1e according to another exemplary embodiment of the inventive concept. In FIG. 6, like reference numerals as those of FIGS. 1 through 5 denote the same elements, and descriptions thereof may be omitted.

Referring to FIG. 6, the semiconductor package 1e includes at least one semiconductor chip 100, a flexible PCB 200e, the mold layer 300, and an electromagnetic interference (EMI) shielding layer 350.

In FIG. 6, one semiconductor chip 100 is shown, but it is not limited thereto. For example, there may be a plurality of the semiconductor chips 100. A case in which the plurality of semiconductor chips 100 are provided will be described below with reference to FIGS. 7 through 12.

The semiconductor package 1e may include a main body 1BDe and an extension wire portion 1ELe. The flexible PCB 200e may include the fixed bending portion 210 and a flexible portion 220e. The plurality of wiring lines 250 may be formed in the flexible PCB 200e. The at least one semiconductor chip 100 may be electrically connected to at least some of the plurality of wiring lines 250. At least one of the plurality of wiring lines 250 may be a ground (GND) wiring line 250G. An EMI pad 240G that is electrically connected to the GND wiring line 250G and exposed on the second surface 204 may be formed on the second surface 204 of the flexible portion 220e in the flexible PCB 200e.

The EMI shielding layer 350 may include, for example, a metal material. In particular, the EMI shielding layer 350 may include, for example, a matrix layer, a metal layer located on the matrix layer, and seed particles existing in an interface between the matrix layer and the metal layer.

The metal layer may include copper (Cu), nickel (Ni), gold (Au), silver (Ag), cobalt (Co), titanium (Ti), chrome (Cr), zirconium (Zr), molybdenum (Mo), ruthenium (Ru), hafnium (Hf), tungsten (W), and rhenium (Re), but is not limited thereto. In certain embodiments, the metal layer may have a thickness of about 0.1 μm to about 1000 μm, but is not limited thereto. The matrix layer may include an arbitrary polymer, but is not limited thereto.

The matrix layer may be formed of, for example, an epoxy resin, a urethane resin, a polyimide resin, an acryl resin, or a polyolefin resin. The polymer that may be used to form the matrix layer may have a weight average molecular weight (MW), for example, of about 5,000 to about 500,000.

The seed particle may include a core particle and a surface modification layer. The surface modification layer may coat at least a part of a surface of the core particle. The seed particle may have the surface modification layer mainly on a portion contacting the matrix layer. The surface modification layer may partially extend into the metal layer along with the surface of the core particle. A part of the surface of the core particle may directly contact the matrix layer, without forming the surface modification layer thereon.

The core particle may be a metal particle or a metal oxide particle. The core particle may have a diameter, for example, of about 0.1 μm to about 70 μm. The metal forming the core particle may be, for example, Cu, Ni, Au, Ag, Pt, Co, Ti, Cr, Zr, Mo, Ru, Hf, W, or Re, but is not limited thereto. The metal oxide forming the core particle may be, for example, silicon oxide, titanium oxide, cerium oxide, tungsten oxide, nickel oxide, zirconium oxide, vanadium oxide, hafnium oxide, or molybdenum oxide, but is not limited thereto.

The surface modification layer may be formed of a certain material that may form ion complex or coordinate complex with the core particle. For example, the material forming the surface modification layer may be a silane group, sillanol group, thiol group, carboxyl group, amino group, ammonium group, nitro group, hydroxyl group, carbonyl group, sulfonic acid group, sulfonium group, oxazoline group, pirrolidone group, nitrile group, or alcoxy group material. The material forming the surface modification layer may be coupled to the core particle via the above functional group. The surface modification layer is an organic compound including the above functional groups, and is not limited thereto. For example, the material forming the surface modification layer may be formed of (un)saturated hydrocarbon, aromatic hydrocarbon, (un)saturated thiol, (un)saturated fatty acid, aromatic carboxylic acid, (un)saturated ketone, aromatic ketone, (un)saturated alcohol, aromatic alcohol, (un)saturated amine, aromatic amine, silane-based or siloxane-based compound, derivatives thereof, condensed products thereof, or polymer induced therefrom. Here, "(un)saturated" denotes "saturated or unsaturated". The condensed products or polymer may be, for example, polyolefin such as polyethylene, polypropylene, and polybutadiene; polyether such as polyethylene glycol and polyprolypene glycol; polystyrene, poly (meth)acrylate, poly(meth)acrylic acid ester, polyvinyl alcohol, polyvinyl ester, phenol resin, melamine resin, epoxy resin, silicon resin, polyimide resin, polyurethane resin, Teflon resin, acrylonitril-styrene resin, syrene-butadiene resin, polyamide resin, polycarbonate resin, polyether sulfone, polyacetal resin, polyether sulfone, or polyphenylene oxide. The surface modification layer may a silane-based compound including alkoxy group having a carbon number of 1 to 10, acetylacetone, or a mixture of the above materials.

The EMI shield layer 350 is connected to the EMI pad 240G, and may cover a surface of the mold layer 300. The EMI shield layer 350 may extend from the surface of the mold layer 300 to the flexible portion 220e, where the EMI pad 240G is formed.

In FIG. 6, the EMI shield layer 350 covers the upper surface of the mold layer 300, but is not limited thereto. For example, the EMI shield layer 350 may also cover side surfaces of the mold layer 300.

Since the EMI shield layer 350 is formed in the semiconductor package 1e, EMI that may be generated by other devices in the system in which the semiconductor package 1e is provided may be prevented.

The semiconductor package 1e of FIG. 6 is the same as the semiconductor package 1 shown in FIG. 1, except for the EMI shield layer 350 and the EMI pad 240G, but is not limited thereto. That is, the semiconductor packages 1a, 1b, 1c, and 1d shown in FIGS. 2 through 5 may further include the EMI shield layer 350 and the EMI pad 240G.

Also, the main body 1BD of the semiconductor package 1e of FIG. 6 denotes the main body 1BDe without the EMI shield layer 350.

Figure 7:
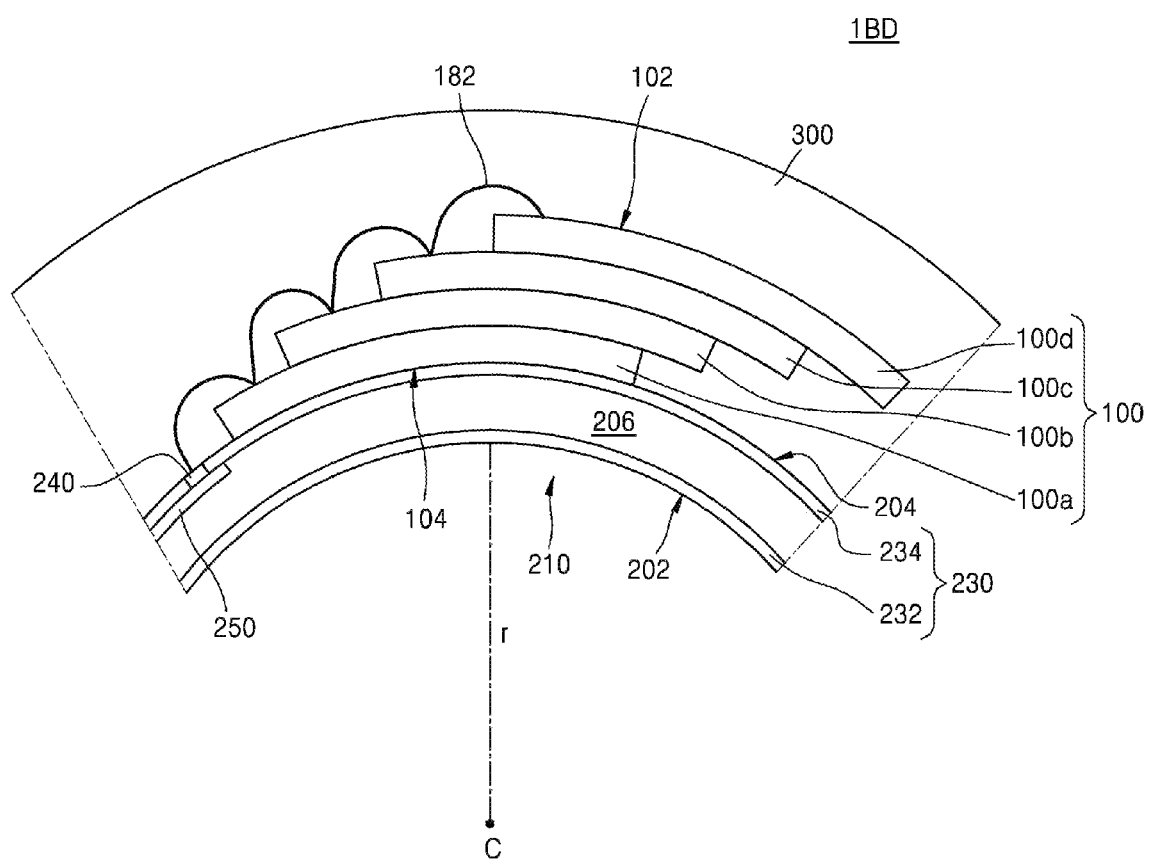
FIG. 7 is a cross-sectional view of a main body in a semiconductor package according to an exemplary embodiment of the inventive concept.

FIG. 7 is a cross-sectional view of a semiconductor package according to an exemplary embodiment of the inventive concept. The main body 1BD shown in FIGS. 7 through 12 may denote the main body 1BD in the semiconductor package 1, 1a, 1b, 1c, or 1d shown in FIGS. 1 through 5, and the main body 1BDe of the semiconductor package 1e of FIG. 6 (without showing the EMI shield layer 350).

Referring to FIG. 7, the main body 1BD may include a plurality of semiconductor chips 100, the fixed bending portion 210, and the mold layer 300.

The plurality of semiconductor chips 100 may include, for example, four semiconductor chips 100a, 100b, 100c, and 100d, but are not limited thereto. For example, the plurality of semiconductor chips 100 may two, three, or five or more semiconductor chips.

Each of the plurality of semiconductor chips 100a, 100b, 100c, and 100d may include an active surface 102 on which a semiconductor device, such as an integrated circuit, is formed, and a non-active surface 104 opposite to the active surface 102. Each of the plurality of semiconductor chips 100a, 100b, 100c, and 100d may be sequentially stacked on the fixed bending portion 210 so that the non-active surfaces 104 face the second surface 204 of the fixed bending portion 210. The plurality of semiconductor chips 100a, 100b, 100c, and 100d may be electrically connected to the fixed bending portion 210, for example, the flexible PCB 200 (see FIG. 1), via bonding wires 182.

In FIG. 7, the plurality of semiconductor chips 100a, 100b, 100c, and 100d are sequentially stacked as a step type, but are not limited thereto. For example, the plurality of semiconductor chips 100a, 100b, 100c, and 100d may be stacked while overlapping with each other, or the plurality of semiconductor chips 100a, 100b, 100c, and 100d may be stacked so that side surfaces thereof form a zig-zag, or spiral shape.

In one embodiment, the plurality of semiconductor chips 100a, 100b, 100c, and 100d may be the same kind of semiconductor chips. For example, the plurality of semiconductor chips 100a, 100b, 100c, and 100d may be DRAM semiconductor chips. In one embodiment, the plurality of semiconductor chips 100a, 100b, 100c, and 100d may have the same area as each other. Though the disclosure is not limited as such.

In one embodiment, the fixed bending portion 210 may have an arch-shape that extends along an arc having a constant radius of curvature r. The fixed bending portion 210 may include an insulating base substrate 206, the plurality of wiring lines 250, and an insulating cover layer 230 covering the first surface 202 and the second surface 204 of the fixed bending portion 210.

The base substrate 206 may be a flexible film formed of a material having a high amount of durability. The base substrate 206 may be formed of, for example, a polyimide (PI) film, a polyester (PET) film, polyester telephthalate, thin glass-epoxy, fluorinated ethylene propylene (FEP), resin-coated paper, liquid polyimide resin, polyethylene naphthalate (PEN) film, or a liquid crystalline polymer (LCP) film.

The wiring line 250 may be formed of, for example, electrolytically deposited (ED) copper foil, rolled-annealed (RA) copper foil, stainless steel foil, aluminum foil, ultra-thin copper foil, sputtered copper, or copper alloys. The wiring line 250 forms one layer, but is not limited thereto, that is, the wiring line 250 may form a plurality of layers.

The cover layer 230 may be formed of, for example, polyimide film, polyester film, flexible solder mask, photoimageable coverlay (PIC), or photo-imageable solder resist. The cover layer 230 may include a first cover layer 232 covering the first surface 202 of the fixed bending portion 210 and a second cover layer 234 covering the second surface 204 of the fixed bending portion 210. The cover layer 230 may be formed by, for example, directly applying a thermosetting ink on the base substrate 206 by using a silk screen printing method or an ink jet printing method, and then, by thermally setting the ink. The cover layer 230 may be formed by, for example, applying a photosensitive solder resist entirely on the base substrate 206 by using the screen printing method or a spray coating method, removing unnecessary portion through an exposure and a development processes, and then, thermally setting the photosensitive solder resist. The cover layer 230 may be also formed by using a laminating method, in which a polyimide film or a polyester film is attached onto the base substrate 206.

A chip connection pad 240 may be exposed in the second surface 204 of the fixed bending portion 210. The chip connection pad is electrically connected to the bonding wire 182 so that the plurality of semiconductor chips 100a, 100b, 100c, and 100d may be electrically connected to the fixed bending portion 210. The chip connection pad 240 may be a part of the wiring line 250 that is exposed on the second surface 204 via the second cover layer 234. The chip connection pad 240 may be a conductive material layer formed, for example, on a part of the wiring line 250, which is not covered by the second cover layer 234.

The first cover layer 232 may cover the entire first surface 202 of the fixed bending portion 210. Thus, in one embodiment, any kind of connection terminal for electrically connecting the plurality of semiconductor chips 100a, 100b, 100c, and 100d to an external device may not be formed on the first surface 202 of the fixed bending portion 210.

The mold layer 300 may be formed on the second surface 204 of the fixed bending portion 210 while surrounding the plurality of semiconductor chips 100a, 100b, 100c, and 100d and the bonding wire 182. The second surface 204 of the fixed bending portion 210 may be covered by the mold layer 300, and therefore may not be exposed outside the semiconductor package. The mold layer 300 may be formed of a rigid material. Because the fixed bending portion 210 is covered by the rigid mold layer 300 so as not to be additionally deformed, the radius of curvature of the fixed bending portion 210 may be constantly maintained. The mold layer 300 may be formed of, for example, an epoxy molding compound (EMC).

Figure 8:
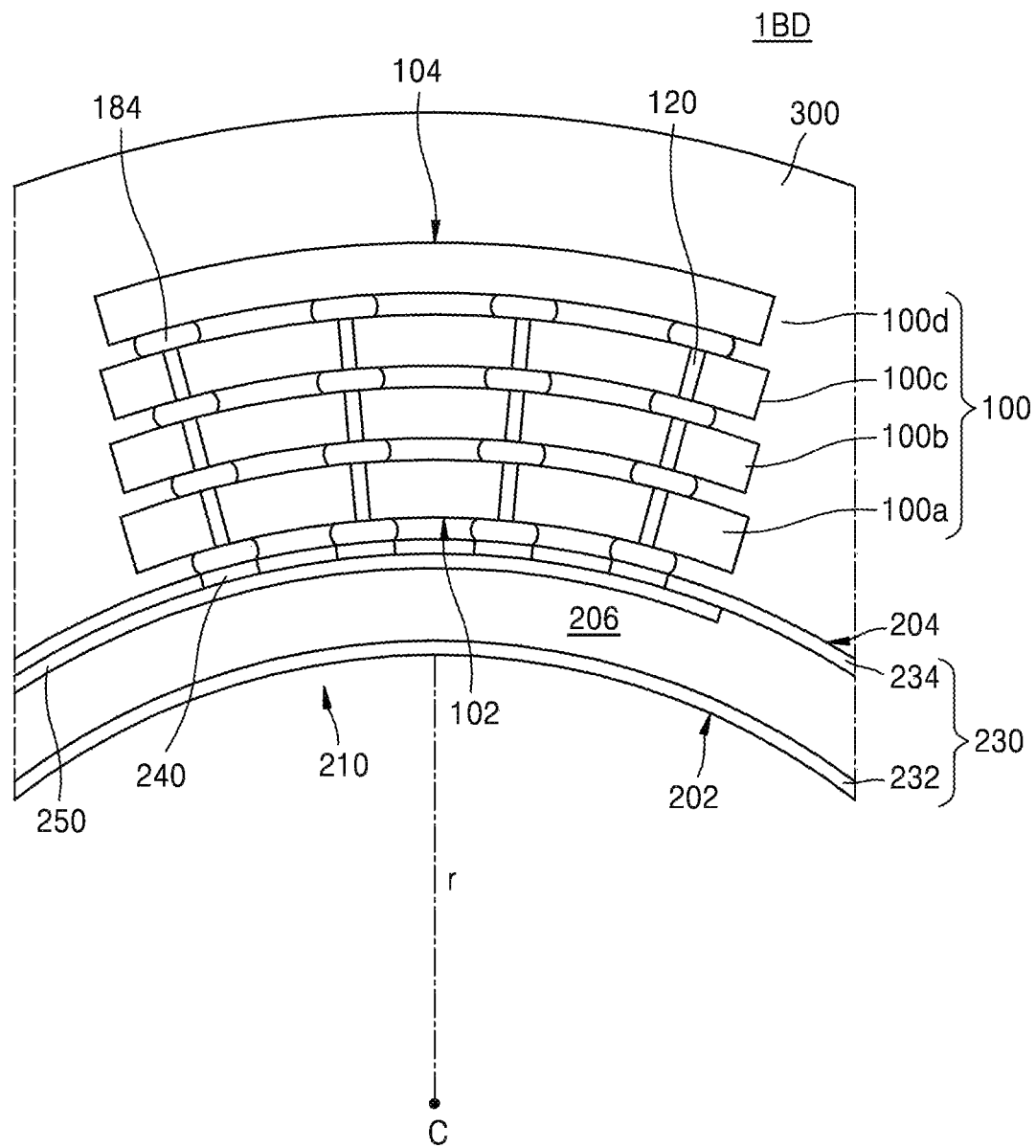
FIG. 8 is a cross-sectional view of a main body in a semiconductor package according to an exemplary embodiment of the inventive concept.

FIG. 8 is a cross-sectional view of the main body 1BD of the semiconductor package according to the exemplary embodiment of the inventive concept. In FIG. 8, like reference numerals as those of FIG. 7 denote the same elements, and descriptions thereof may be omitted.

Referring to FIG. 8, the main body 1BD may include a plurality of semiconductor chips 100, the fixed bending portion 210, and the mold layer 300.

The plurality of semiconductor chips 100 may include, for example, four semiconductor chips 100a, 100b, 100c, and 100d, but are not limited thereto. For example, the plurality of semiconductor chips 100 may two, three, or five or more semiconductor chips.

Each of the plurality of semiconductor chips 100a, 100b, 100c, and 100d may include an active surface 102 on which a semiconductor device is formed, and a non-active surface 104 opposite to the active surface 102. Each of the plurality of semiconductor chips 100a, 100b, 100c, and 100d may be sequentially stacked on the fixed bending portion 210 so that the non-active surface 104 faces the second surface 204 of the fixed bending portion 210. The plurality of semiconductor chips 100a, 100b, 100c, and 100d may be electrically connected to the fixed bending portion 210, for example, the flexible PCB 200 (see FIG. 1), via connection bumps 184 and conductive through vias, also described as through electrodes.

From among the plurality of semiconductor chips 100a, 100b, 100c, and 100d, upper semiconductor chip may be electrically connected to the fixed bending portion 210 via the connection bump 184 and a through electrode 120 formed in a lower semiconductor chip. For example, the uppermost semiconductor chip 100d may be electrically connected to the fixed bending portion 210 via the connection bump 184 and the through electrodes 120 formed in the lower semiconductor chips 100a, 100b, and 100c. The through electrode 120 may not be formed in the uppermost semiconductor chip 100d, but this embodiment is not limited thereto. For example, the through electrodes 120 may be formed in all of the plurality of semiconductor chips 100a, 100b, 100c, and 100d.

The through electrode 120 may be a through substrate via (TSV, such as a through silicon via). In certain embodiments, the through electrode 120 may include a wiring metal layer and a barrier metal layer surrounding the wiring metal layer. The wiring metal layer may include, for example, Cu or W. For example, the wiring metal layer may be formed of Cu, CuSn, CuMg, CuNi, CuZn, CuPd, CuAu, CuRe, CuW, W, or W alloys, but it is not limited thereto. For example, the wiring metal layer may include one or more selected from Al, Au, Be, Bi, Co, Cu, Hf, In, Mn, Mo, Ni, Pb, Pd, Pt, Rh, Re, Ru, Ta, Te, Ti, W, Zn, and Zr, or a stacked structure of one or more selected from the above. The barrier metal layer may include at least one selected from W, WN, WC, Ti, TiN, Ta, TaN, Ru, Co, Mn, Ni, and NiB, and may have a single-layered or a multi-layered structure. However, the material forming the through electrode 120 is not limited to the above examples. The barrier metal layer and the wiring metal layer may be formed by a physical vapour deposition (PVD) process or a chemical vapour deposition (CVD) process, but is not limited thereto. A spacer insulating layer may be disposed between the through electrode 120 and the semiconductor substrate forming the semiconductor chip 100a, 100b, or 100c, in which the through electrode 120 is formed. The spacer insulating layer may prevent the through electrode 120 from contacting the semiconductor device included in the semiconductor substrate, in which the through electrode 120 is formed. The spacer insulating layer may be formed, for example, of an oxide layer, a nitride layer, a carbonated layer, a polymer, or a combination thereof. In some embodiments, the spacer insulating layer may be formed by using the CVD process. The spacer insulating layer may be a high aspect ratio process (HARP) oxide layer based on ozone/tetra-ethyl ortho-silicate ($O_3$/TEOS) formed through a sub-atmospheric CVD process.

The through electrode 120 may have one of a via-first structure, a via-middle structure, and a via-last structure. The via-first, the via-middle, and the via-last structures and methods of manufacturing the same are already disclosed in various documents including Three Dimensional System Integration, 2011 published by Springer, 3D Integration for VLSI Systems, 2012 published by CRC Press, and Designing TSVs for 3D Integrated Circuits, 2013 published by Springer, each of which is incorporated herein by reference in its entirety. Thus, detailed descriptions thereof are omitted here.

In one embodiment, the plurality of semiconductor chips 100a, 100b, 100c, and 100d may be the same kind of semiconductor chips. For example, the plurality of semiconductor chips 100a, 100b, 100c, and 100d may be DRAM semiconductor chips. In addition, the plurality of semiconductor chips 100a, 100b, 100c, and 100d may have the same area as each other. However, the disclosure is not limited thereto.

Figure 9:
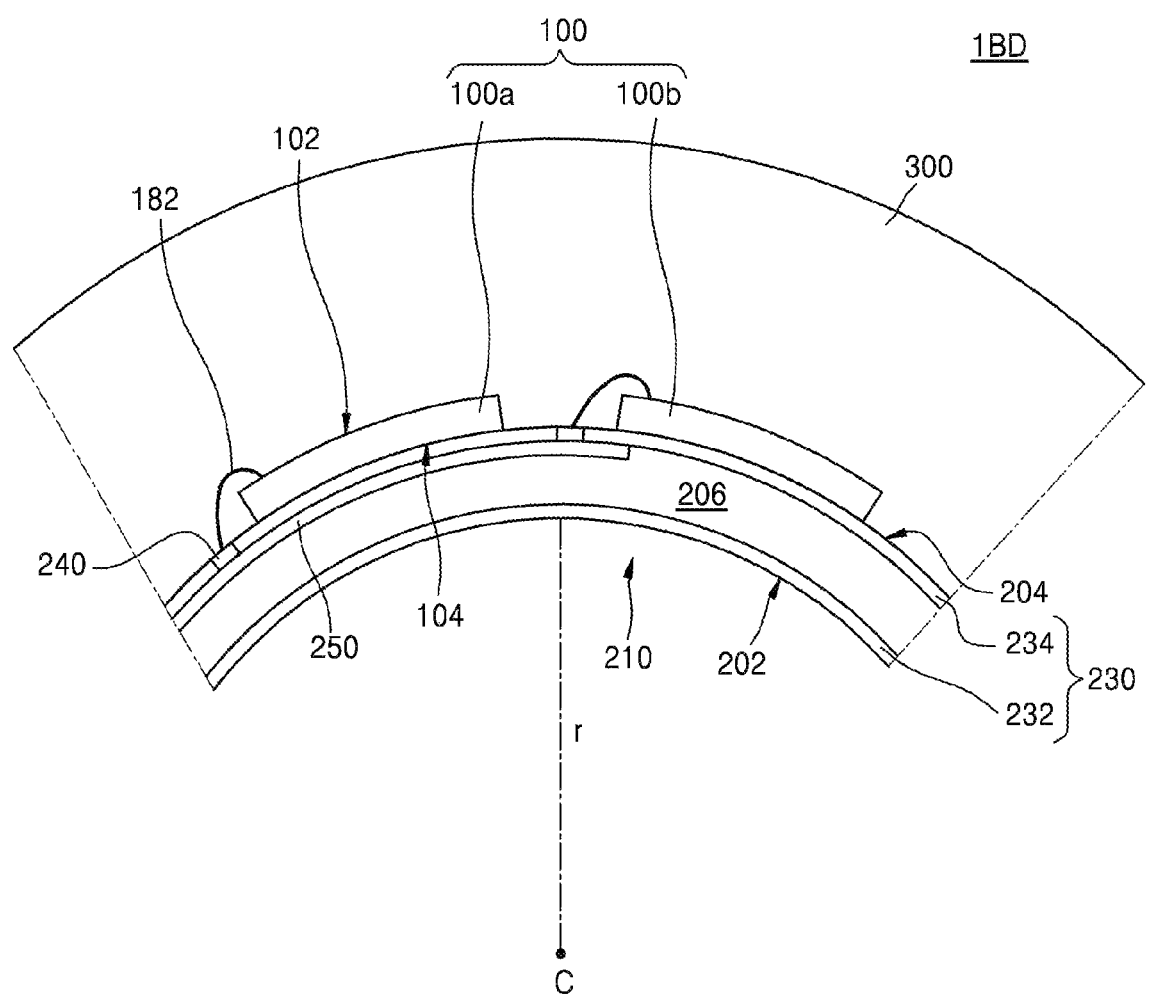
FIG. 9 is a cross-sectional view of a main body in a semiconductor package according to an exemplary embodiment of the inventive concept.

FIG. 9 is a cross-sectional view of the main body 1BD of the semiconductor package according to an exemplary embodiment of the inventive concept. In FIG. 9, like reference numerals as those of FIG. 7 denote the same elements, and descriptions thereof may be omitted.

Referring to FIG. 9, the main body 1BD may include a plurality of semiconductor chips 100, the fixed bending portion 210, and the mold layer 300.

The plurality of semiconductor chips 100 may include, for example, two semiconductor chips 100a and 100b, but are not limited thereto. That is, the plurality of semiconductor chips 100 may include three or more semiconductor chips. Also, the plurality of semiconductor chips 100 may include a plurality of stacks of semiconductor chips, such as the stacks shown in FIG. 7, for example.

Each of the plurality of semiconductor chips 100a and 100b may include an active surface 102 on which a semiconductor device is formed, and a non-active surface 104 opposite to the active surface 102. Each of the plurality of semiconductor chips 100a and 100b may be attached to the fixed bending portion 210 so that the non-active surface 104 faces the second surface 204 of the fixed bending portion 210. The plurality of semiconductor chips 100a and 100b may be electrically connected to the fixed bending portion 210, that is, the flexible PCB 200 (see FIG. 1), via the bonding wire 182.

As shown in FIG. 9, the plurality of semiconductor chips 100a and 100b are not part of chip stacks, but each is directly attached to the second surface 204 of the fixed bending portion 210. However, as mentioned above, additional semiconductor chips may be further stacked on at least one of the plurality of semiconductor chips 100a and 100b.

The plurality of semiconductor chips 100a and 100b may be the same kind or different kinds of semiconductor chips. The plurality of semiconductor chips 100a and 100b may have the same area as or different area from each other.

Figure 10:
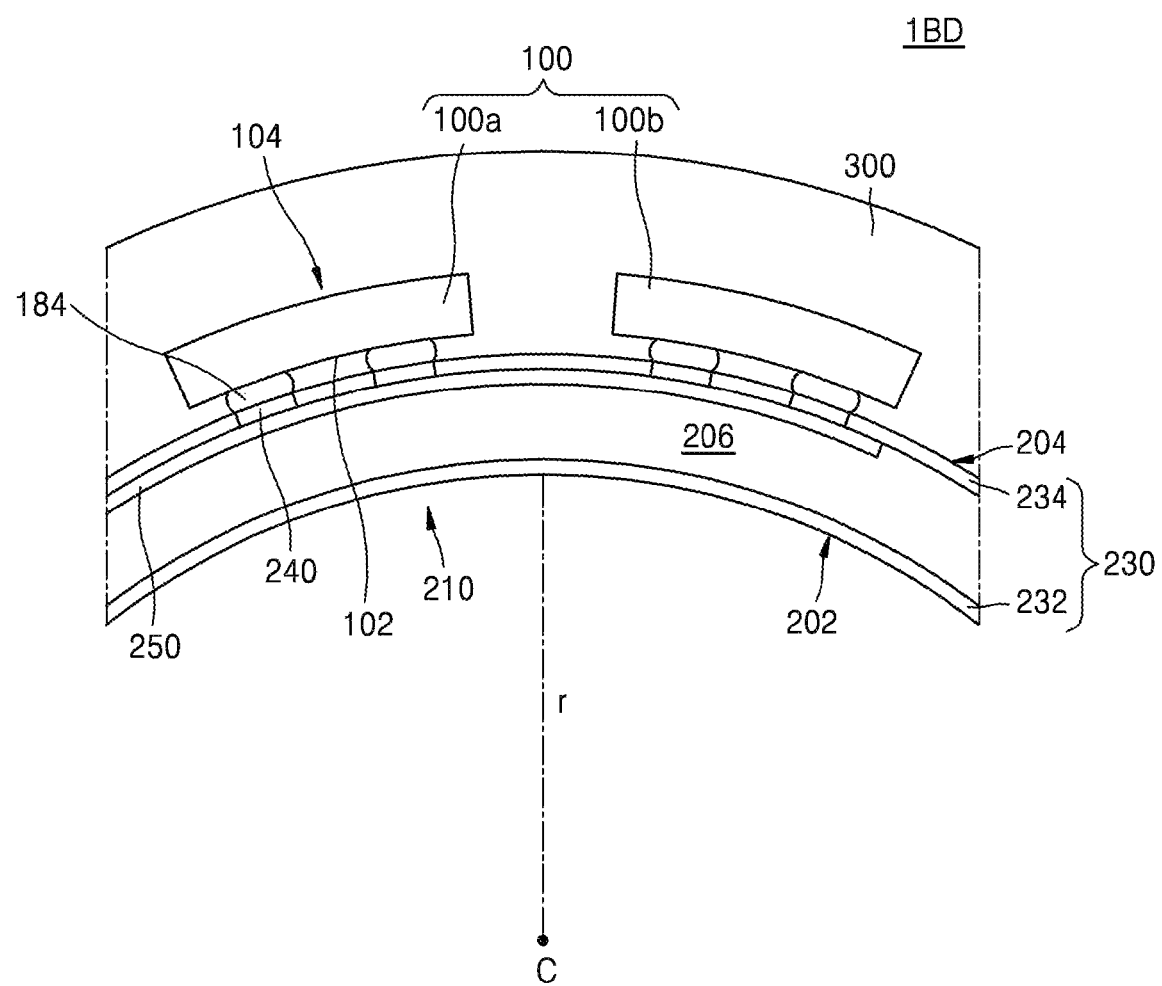
FIG. 10 is a cross-sectional view of a main body in a semiconductor package according to an exemplary embodiment of the inventive concept.

FIG. 10 is a cross-sectional view of the main body 1BD of the semiconductor package according to the exemplary embodiment of the inventive concept. In FIG. 10, like reference numerals as those of FIG. 8 denote the same elements, and descriptions thereof may be omitted.

Referring to FIG. 10, the main body 1BD may include a plurality of semiconductor chips 100, the fixed bending portion 210, and the mold layer 300.

The plurality of semiconductor chips 100 may include, for example, two semiconductor chips 100a and 100b. However, the inventive concept is not limited thereto, that is, the plurality of semiconductor chips 100 may include three or more semiconductor chips.

Each of the plurality of semiconductor chips 100a and 100b may include an active surface 102 on which a semiconductor device is formed, and a non-active surface 104 opposite to the active surface 102. Each of the plurality of semiconductor chips 100a and 100b may be attached to the fixed bending portion 210 so that the active surface 102 faces the second surface 204 of the fixed bending portion 210. For example, the semiconductor chips 100a and 100b may be attached in a flip-chip manner. The plurality of semiconductor chips 100a and 100b may be electrically connected to the fixed bending portion 210, for example, the flexible PCB 200 (see FIG. 1), via the connection bumps 184.

As shown in FIG. 9, the plurality of semiconductor chips 100a and 100b are not stacked, but are attached to the second surface 204 of the fixed bending portion 210. However, additional semiconductor chips may be further stacked on at least one of the plurality of semiconductor chips 100a and 100b.

The plurality of semiconductor chips 100a and 100b may be the same kind or different kinds of semiconductor chips. The plurality of semiconductor chips 100a and 100b may have the same area as or different area from each other.

Figure 11:
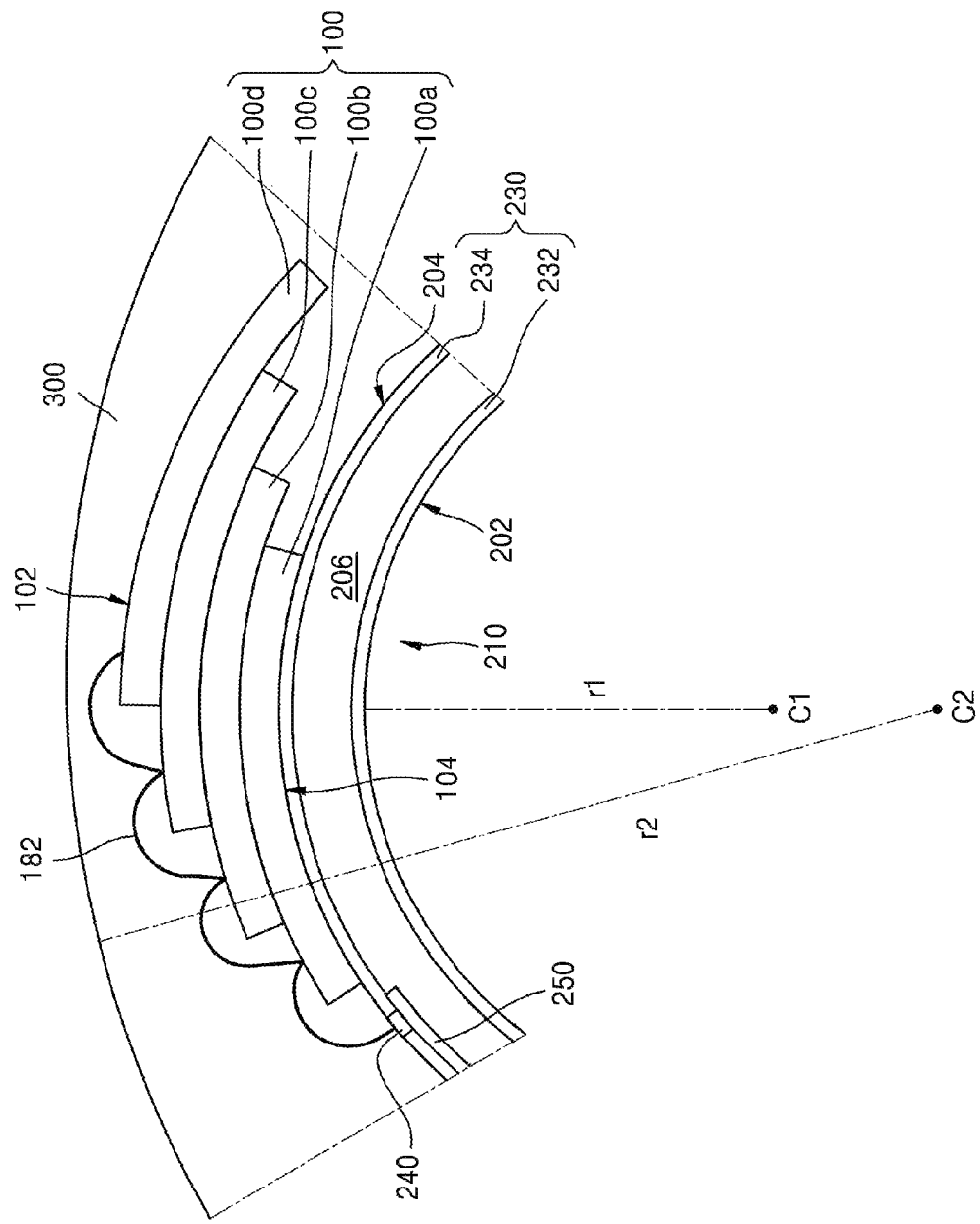
FIG. 11 is a cross-sectional view of a main body in a semiconductor package according to an exemplary embodiment of the inventive concept.

FIG. 11 is a cross-sectional view of the main body of the semiconductor package according to an exemplary embodiment of the inventive concept. In FIG. 11, like reference numerals as those of FIG. 7 denote the same elements, and descriptions thereof may be omitted.

Referring to FIG. 11, the main body 1BD may include a plurality of semiconductor chips 100, the fixed bending portion 210, and the mold layer 300.

The fixed bending portion 210 may have an arch-shape that extends along with an arc having a first radius of curvature r1. An upper surface of the mold layer 300 may extend along with an arm having a second radius of curvature r2 that is greater than the first radius of curvature r1.

Here, the second radius of curvature r2 that is greater than the first radius of curvature r1 denotes that the second radius of curvature r2 is greater than the first radius of curvature r1 even if the mold layer 300 is very small in thickness. Therefore, the second radius of curvature r2 may be greater than the first radius of curvature r1 by a value greater than the thickness of the mold layer 300. A center of curvature C2 with respect to the upper surface of the mold layer 300 may be farther from the fixed bending portion 210 than a center of curvature C1 of the fixed bending portion 210. Therefore, a thickness of the main body 1BD from a center of the main body 1BD may be less than a thickness of the main body 1BD at an end portion in an arc direction (e.g., each thickness may be measured from first surface 202 of the fixed bending portion 210 to an external surface of the mold layer 300, in a direction extending radially away from the center of curvature C1).

A shape of the upper surface of the mold layer 300 may be determined by an upper cavity (e.g., 30 of FIG. 21) that will be described later.

The first radius of curvature r1 and the second radius of curvature r2 may be determined according to an entire shape of a system, in which the semiconductor package 1, 1a, 1b, 1c, 1d, or 1e in FIGS. 1 through 6 including the main body 1BD is to be provided.

Figure 12:
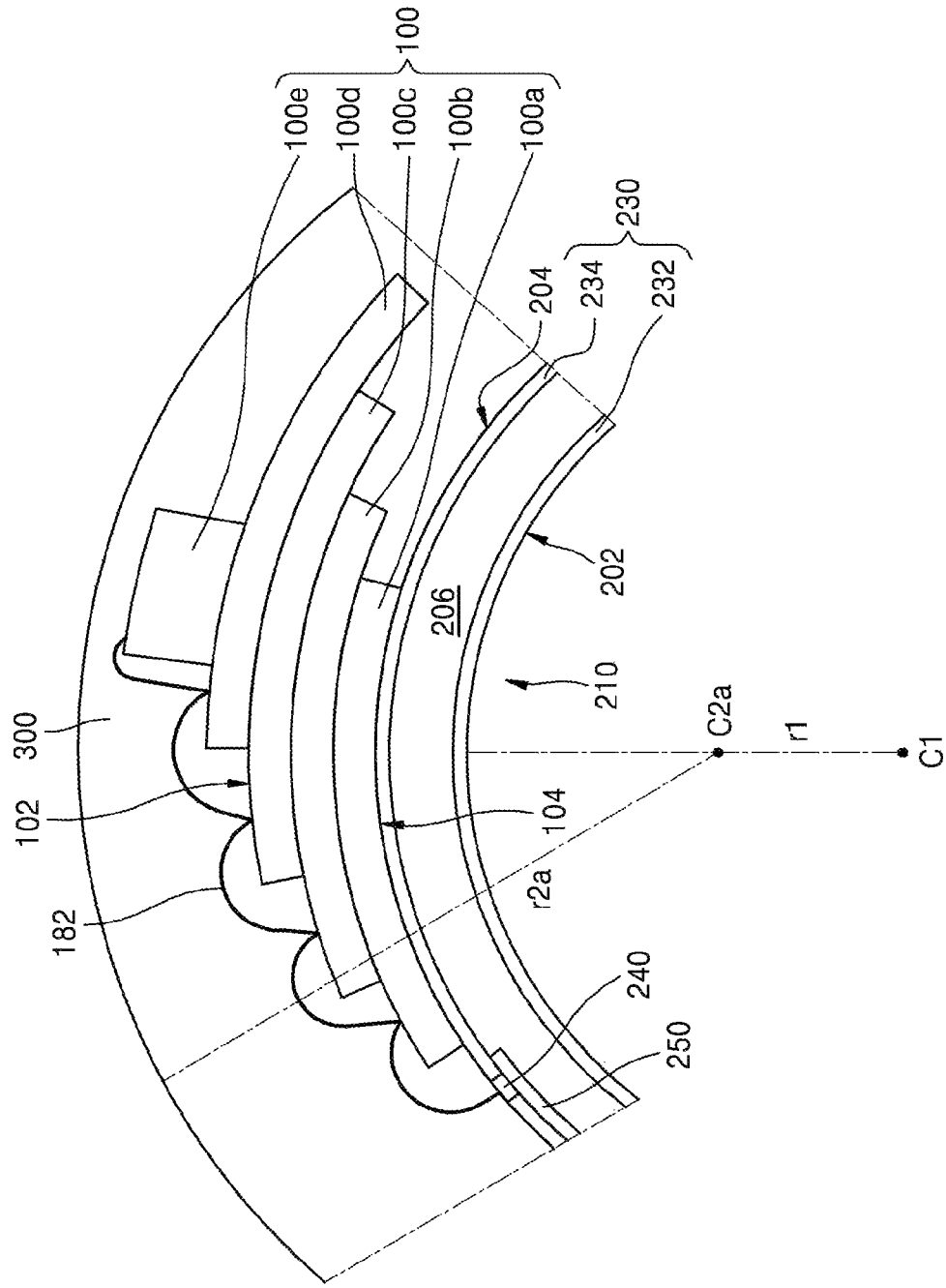
FIG. 12 is a cross-sectional view of a main body in a semiconductor package according to an exemplary embodiment of the inventive concept.

FIG. 12 is a cross-sectional view of the main body 1BD of the semiconductor package according to an exemplary embodiment of the inventive concept. In FIG. 12, like reference numerals as those of FIG. 11 denote the same elements, and descriptions thereof may be omitted.

Referring to FIG. 12, the main body 1BD may include a plurality of semiconductor chips 100, the fixed bending portion 210, and the mold layer 300.

The fixed bending portion 210 may have an arch-shape extending along with an arc having a first radius of curvature r1. An upper surface of the mold layer 300 may extend along with an arc having a second radius of curvature r2a that is less than the first radius of curvature r1. A shape of the upper surface of the mold layer 300 may be determined by an upper cavity (e.g., 30 of FIG. 21) that will be described later. For example, the second radius of curvature r2a that is the radius of curvature of the entire upper surface of the main body 1BD may be less than the first radius of curvature r1 that is the radius of curvature of the entire lower surface of the main body 1BD. A center of curvature C2a with respect to the upper surface of the mold layer 300 may be closer to the fixed bending portion 210 than the center of curvature C1 with respect to the fixed bending portion 210 is. Therefore, a thickness of the main body 1BD at the center thereof may be greater than that of the main body 1BD at an end in the arc direction.

The first radius of curvature r1 and the second radius of curvature r2a may be determined according to an entire shape of the system in which the semiconductor package 1, 1a, 1b, 1c, 1d, or 1e of FIGS. 1 through 6 including the main body 1BD are included.

The main body 1BD may include a plurality of semiconductor chips 100a, 100b, 100c, 100d, and 100e that are sequentially stacked. The uppermost semiconductor chip 100e from among the plurality of semiconductor chips 100a, 100b, 100c, 100d, and 100e may have a less area than the semiconductor chip 100d under the uppermost semiconductor chip 100e.

Otherwise, the uppermost semiconductor chip 100e from among the plurality of semiconductor chips 100a, 100b, 100c, 100d, and 100e has a less area than those of the semiconductor chips 100a, 100b, 100c, and 100d, and the other semiconductor chips 100a, 100b, 100c, and 100d may have the same area as each other. For example, the uppermost semiconductor chip 100e may be a controller semiconductor chip, and the other semiconductor chips 100a, 100b, 100c, and 100d may be memory semiconductor chips that are controlled by the controller semiconductor chip.

If the uppermost semiconductor chip 100e from among the plurality of semiconductor chips 100a, 100b, 100c, 100d, and 100e has less area, the thickness of the main body 1BD at the center thereof is set to be greater than that at the end in the arc direction so that a volume of the semiconductor package 1, 1a, 1b, 1c, 1d, or 1e of FIGS. 1 through 6 including the main body 1BD may be minimized.

Figure 13:
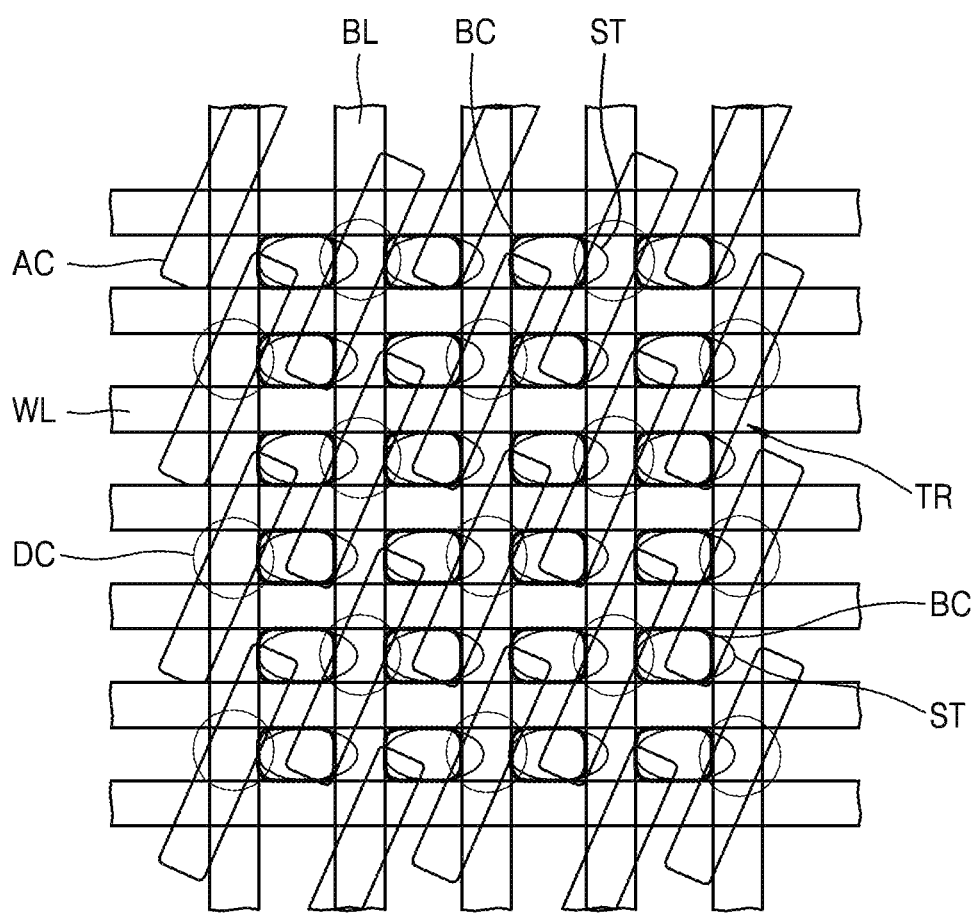
FIG. 13 is a layout showing arrangement of some elements in a semiconductor chip included in a semiconductor package according to an exemplary embodiment of the inventive concept.

FIG. 13 is a layout showing arrangements of some elements in the semiconductor chip 100 included in the semiconductor package according to the exemplary embodiment of the inventive concept. The elements shown in FIG. 13 may be formed on an active area of the semiconductor chip. FIG. 13 exemplarily shows the arrangement of some elements in a DRAM semiconductor chip, but the inventive concept is not limited thereto. For example, semiconductor chips including a plurality of MOSFET devices may be applied.

Referring to FIG. 13, the semiconductor chip 100 may include a plurality of active areas ACT. Each of the plurality of active areas ACT may have an elongated island shape having a shorter axis and a longer axis. Each of the plurality of active areas ACT may have a longer axis extending diagonally with respect to a first direction. A plurality of word lines WL extend in a second direction that is perpendicular to the first direction in parallel with each other across the plurality of active areas ACT. The plurality of word lines WL may be arranged with at constant intervals. A plurality of bit lines BL extend above the plurality of word lines WL in the first direction in parallel with each other.

The plurality of bit lines BL are connected to the plurality of active areas ACT via a plurality of direct contacts DC. One active area ACT may be electrically connected to one direct contact DC.

A plurality of buried contacts BC may be formed in a region between two adjacent bit lines BL. In some embodiments, the plurality of buried contacts BC may be spaced apart from each other along the first direction, that is, a length direction of the region between the two adjacent bit lines BL.

The plurality of buried contacts BC may electrically connect a storage node ST that is a capacitor lower electrode to the active area ACT. One active area ACT may be electrically connected to two buried contacts BC, respectively.

The plurality of storage nodes ST may be formed on the plurality of bit lines BL.

A plurality of transistor devices TR may be formed on the plurality of active areas ACT by the plurality of word lines WL and the plurality of bit lines BL that extend perpendicularly to each other. The plurality of transistor devices TR may be, for example, MOSFET devices. One active area ACT may include, for example, two transistor devices TR.

A channel direction of the transistor device TR that is the MOSFET device may form an acute angle with the first direction that is perpendicular to the extension direction of the plurality of word lines WL, but is not limited thereto. For example, the channel direction of the transistor device TR included in the semiconductor chip 100 may be the same as the direction, in which a gate electrode line for forming the transistor device TR (for example, the word lines WL in the DRAM) extends.

Thus, the channel direction of the transistor device TR that is the MOSFET device may be the same as or may form the acute angle with the gate electrode line for forming the transistor device TR.

Therefore, if the transistor device TR is compressive strained or tensile strained in a direction of the gate electrode line for forming the transistor device TR, the compressive strain or the tensile strain may be made also in the channel direction of the transistor device TR.

In the layout of FIG. 13 and layouts that will be provided later, elements adjacent to the edges may be omitted or cut for convenience of description, and arrangements and shapes of the elements are not limited thereto.

Figure 14:
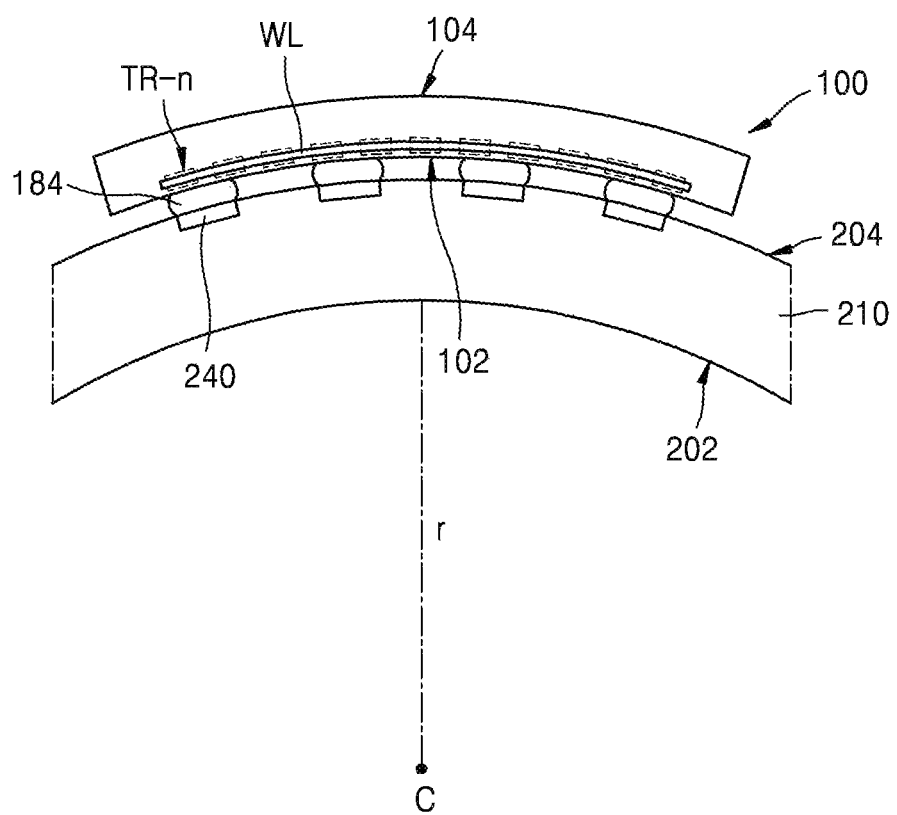
FIG. 14 is a cross-sectional view showing a semiconductor chip included in a semiconductor package according to an exemplary embodiment of the inventive concept, wherein the semiconductor chip is attached to a flexible printed circuit board.

FIG. 14 is a cross-sectional view of a semiconductor chip 100 included in the semiconductor package according to an exemplary embodiment of the inventive concept, wherein the semiconductor chip 100 is attached to the fixed bending portion 210 of the flexible PCB 200.

Referring to FIGS. 13 and 14, the semiconductor chip 100 is attached onto the fixed bending portion 210 so that the active surface 102 may face the second surface 204 of the fixed bending portion 210. The semiconductor chip 100 may be electrically connected to the fixed bending portion 210 via the connection bumps 184. The semiconductor chip 100 includes the word lines WL formed on the active surface and a plurality of n-type MOSFET devices TR-n formed by the word lines WL. The fixed bending portion 210 may have an arch-shape extending along an arc having a constant radius of curvature r.

The semiconductor chip 100 may be disposed so that the word lines WL may extend along the arc direction, in which the fixed bending portion 210 extends. For example, the word lines WL may have an arc shape similar to that of the fixed bending portion 210. Therefore, since the n-type MOSFET device TR-n is compressive strained in a direction perpendicular to the channel direction thereof, the n-type MOSFET device TR-n may be tensile strained in the channel direction thereof. Accordingly, mobility in the n-type MOSFET device TR-n may be improved, and performances of the semiconductor chip 100 may be improved.

Figure 15:
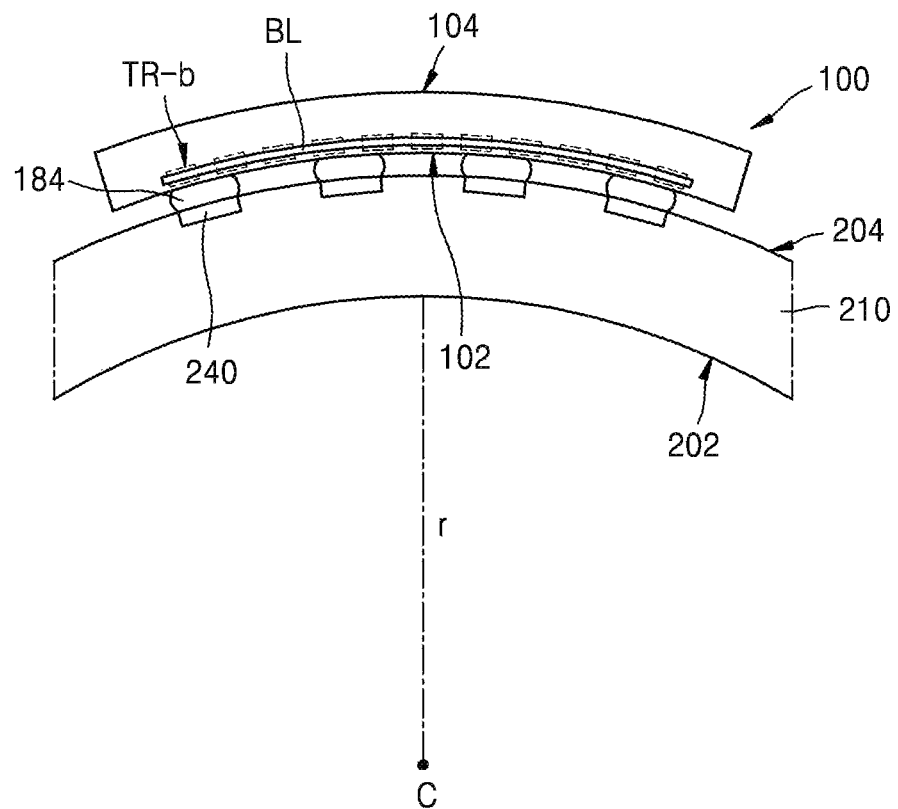
FIG. 15 is a cross-sectional view showing a semiconductor chip included in a semiconductor package according to an exemplary embodiment of the inventive concept, wherein the semiconductor chip is attached to a flexible printed circuit board.

FIG. 15 is a cross-sectional view of a semiconductor chip 100 included in the semiconductor package according to an exemplary embodiment of the inventive concept, wherein the semiconductor chip 100 is attached onto the flexible PCB 200.

Referring to FIGS. 13 and 15, the semiconductor chip 100 is attached onto the fixed bending portion 210 so that the active surface 102 may face the second surface 204 of the fixed bending portion 210. The semiconductor chip 100 may be electrically connected to the fixed bending portion 210 via the connection bumps 184. The semiconductor chip 100 includes the bit lines BL formed on the active surface 102 and a plurality of p-type MOSFET devices TR-p formed by the bit lines BL. The fixed bending portion 210 may have an arch-shape extending along an arc having a constant radius of curvature r.

The semiconductor chip 100 may be disposed so that the bit lines BL may extend along the arc direction, in which the fixed bending portion 210 extends. For example, the bit lines BL may have an arc shape similar to that of the fixed bending portion 210. Therefore, the p-type MOSFET device TR-p may be compressive strained in the channel direction thereof. Accordingly, mobility in the p-type MOSFET device TR-p may be improved, and performances of the semiconductor chip 100 may be improved.

Figure 16:
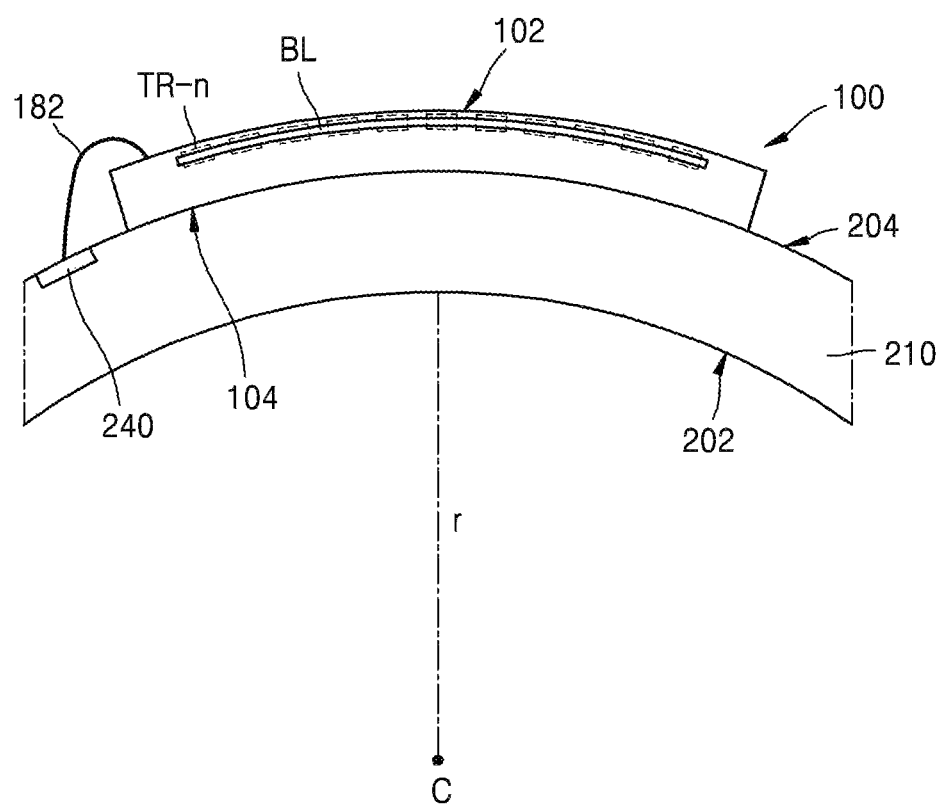
FIG. 16 is a cross-sectional view showing a semiconductor chip included in a semiconductor package according to an exemplary embodiment of the inventive concept, wherein the semiconductor chip is attached to a flexible printed circuit board.

FIG. 16 is a cross-sectional view of a semiconductor chip 100 included in the semiconductor package according to an exemplary embodiment of the inventive concept, wherein the semiconductor chip 100 is attached to the flexible PCB 200.

Referring to FIGS. 13 and 16, the semiconductor chip 100 may be attached to the fixed bending portion 210 so that the non-active surface 104 thereof may face the second surface 204 of the fixed bending portion 210. The semiconductor chip 100 may be electrically connected to the fixed bending portion 210 via the bonding wire 182. The semiconductor chip 100 may include bit lines BL formed on the active surface 102 and a plurality of n-type MOSFET devices TR-n formed by the bit lines BL. The fixed bending portion 210 may have an arch-shape extending along an arc having a constant radius of curvature r.

The semiconductor chip 100 may be disposed so that the bit lines BL may extend along the arc direction, in which the fixed bending portion 210 extends. For example, the bit lines BL may have an arc shape similar to that of the fixed bending portion 210. Therefore, the n-type MOSFET device TR-n may be tensile strained in the channel direction thereof. Accordingly, mobility in the n-type MOSFET device TR-n may be improved, and performances of the semiconductor chip 100 may be improved.

Figure 17:
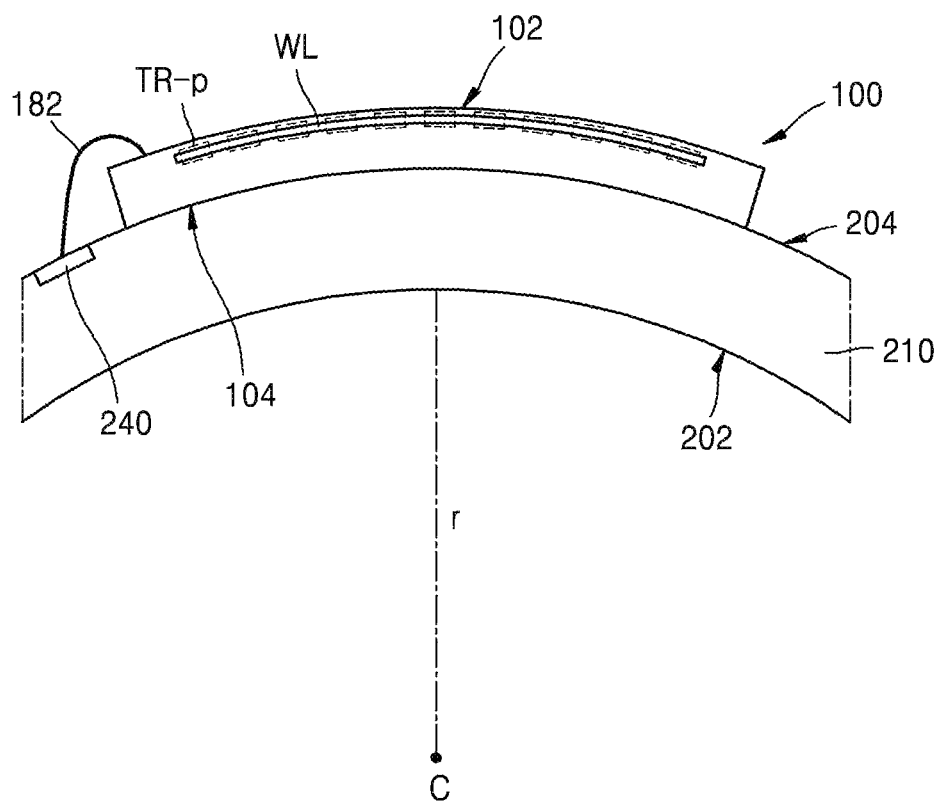
FIG. 17 is a cross-sectional view showing a semiconductor chip included in a semiconductor package according to an exemplary embodiment of the inventive concept, wherein the semiconductor chip is attached to a flexible printed circuit board.

FIG. 17 is a cross-sectional view of a semiconductor chip 100 included in the semiconductor package according to an exemplary embodiment of the inventive concept, wherein the semiconductor chip 100 is attached to the flexible PCB 200.

Referring to FIGS. 13 and 17, the semiconductor chip 100 is attached onto the fixed bending portion 210 so that the non-active surface 104 thereof may face the second surface 204 of the fixed bending portion 210. The semiconductor chip 100 may be electrically connected to the fixed bending portion 210 via the bonding wire 182. The semiconductor chip 100 includes word lines WL formed on the active surface 102 and a plurality of p-type MOSFET devices TR-p formed by the word lines WL. The fixed bending portion 210 may have an arch-shape extending along an arc having a constant radius of curvature r.

The semiconductor chip 100 may be disposed so that the word lines WL may extend in the arc direction in which the fixed bending portion 210 extends. For example, the word lines WL may have an arc shape similar to that of the fixed bending portion 210. Therefore, the p-type MOSFET device TR-p is tensile strained in a direction perpendicular to the channel direction, and thus the p-type MOSFET device TR-p may be compressive strained in the channel direction thereof. Accordingly, the mobility in the p-type MOSFET device TR-p may be improved, and thus, the performances of the semiconductor chip 100 may be also improved.

Referring to FIGS. 13 through 17, if the semiconductor chip 100 includes the plurality of transistor devices TR that are the MOSFET devices, the semiconductor chip 100 is attached to the fixed bending portion 210 to have an arch-shape. Thus, the semiconductor chip 100 is strained, and accordingly, the mobility of the plurality of transistor devices TR that are the MOSFET devices may be increased to be greater than that of the semiconductor chip 100 that is flat.

The semiconductor package according to the embodiments of the inventive concept is curved, but the portion to which the semiconductor chip is attached is not subsequently deformed. Thus, the performance of the semiconductor chip included in the semiconductor package may be maintained constantly. Also, since the semiconductor chip is curved, the transistor devices in the semiconductor chip are strained, and accordingly, the mobility of the semiconductor chip may be improved.

Also, terminals for connecting the external device to the semiconductor package are not formed on the curved portion, (e.g., the main body), so stabilized electric connection between the external device and the semiconductor package may be provided, and a height of the semiconductor package may be reduced.

In addition, since the main body of the semiconductor package is formed along with the curved shape of the semiconductor chip included in the semiconductor package, the semiconductor package may be small in thickness.

FIGS. 14 and 16 show the n-type MOSFET devices TR-n, and FIGS. 15 and 17 show the p-type MOSFET devices TR-p, but the embodiments of the inventive concept are not limited thereto. For example, if the semiconductor chip 100 includes both the n-type MOSFET devices and the p-type MOSFET devices, the direction of attaching the semiconductor chip 100 onto the fixed bending portion 210 may be determined so that the mobility may be improved based on main MOSFET devices forming the semiconductor chip 100.

FIGS. 14 through 17 show only one semiconductor chip 100 as an example however, if the semiconductor package includes a plurality of semiconductor chips, the semiconductor package may include combination of the semiconductor chips 100 shown in FIGS. 14 through 17. The plurality of chips may be vertically stacked, or horizontally adjacent each other. In one example, if the semiconductor chips in the semiconductor package are the same kind of semiconductor chips, a plurality of semiconductor chips 100 shown in one of FIGS. 14 through 17 may be provided.

FIG. 14 through 17 shows that the semiconductor chip 100 having the word lines WL and the bit lines BL extending perpendicularly to the same angle is attached to the fixed bending portion 210, but the inventive concept is not limited thereto. For example, aspects of the inventive concept may be applied to any kind of semiconductor chip including a plurality of MOSFET devices. In certain embodiments, for example, the word lines WL may correspond to gate lines for forming the plurality of MOSFET devices, and the bit lines BL may be signal lines that extend perpendicularly from the gate lines.

FIGS. 18 through 24 are perspective views of a method of manufacturing a semiconductor package, according to an embodiment of the inventive concept. In FIGS. 18 through 24, contours of only the flexible PCB 200 and the semiconductor chip 100 are shown, and the chip connection pad 240, the EMI pad 240G, the wiring lines 250, and members for connecting the semiconductor chip 100 and the flexible PCB as shown in the semiconductor packages 1, 1*a*, 1*b*, 1*c*, 1*d*, and 1*e* of FIGS. 1 through 6 are omitted.

Figure 18:
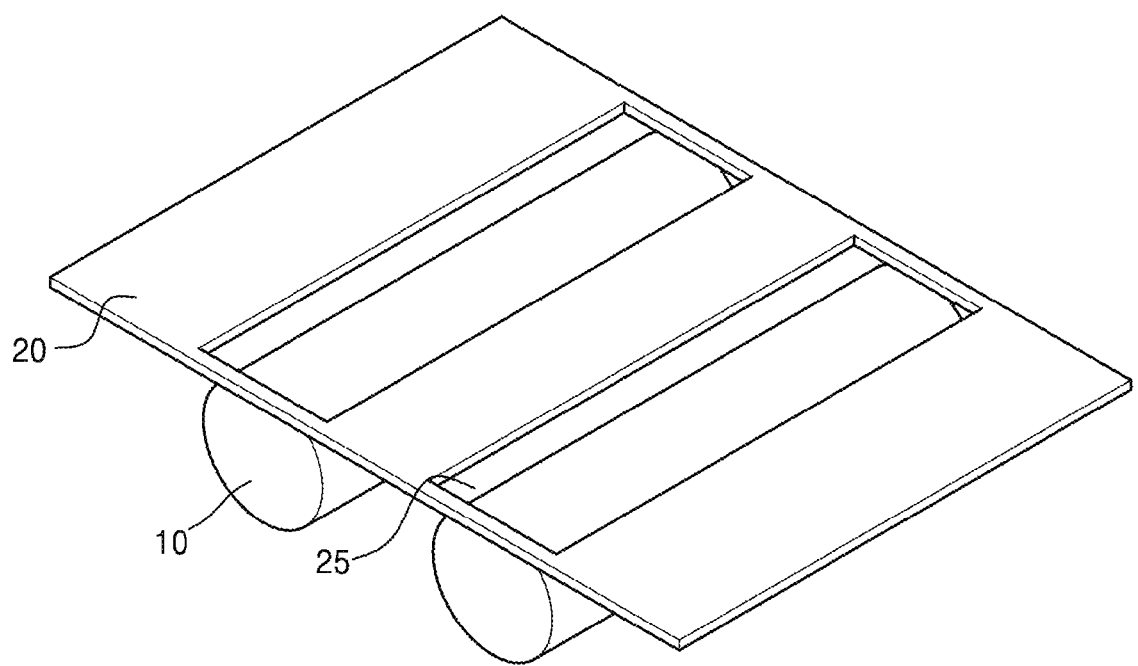
FIG. 18 is a perspective view of a lower cavity and a bending roller for manufacturing a semiconductor package according to an exemplary embodiment of the inventive concept.

FIG. 18 is a perspective view of a lower cavity 20 and a bending roller 10 for manufacturing the semiconductor package according to one exemplary embodiment of the inventive concept.

Referring to FIG. 18, the lower cavity 20 on which the flexible PCB (200 of FIG. 19) is to be placed and the bending roller 10 for curving the flexible PCB (200 of FIG. 19) are prepared. The lower cavity 20 may include figuration holes 25 penetrating from an upper surface to a lower surface of the lower cavity 20. The bending roller 10 may elevate from a lower portion of the lower cavity 20 through the figuration hole 25 to curve the flexible PCB (200 of FIG. 19). In one embodiment, the bending roller 10 may have a cylindrical shape, and the figuration hole 25 may be rectangular so that at least a part of the bending roller 10 may pass therethrough. The lower cavity 20 may also be described as a platform, and may be formed to have a planar surface, having openings therein, where the bending rollers 10 may be placed. For example, the lower cavity 20 may have a plate shape.

Figure 19:
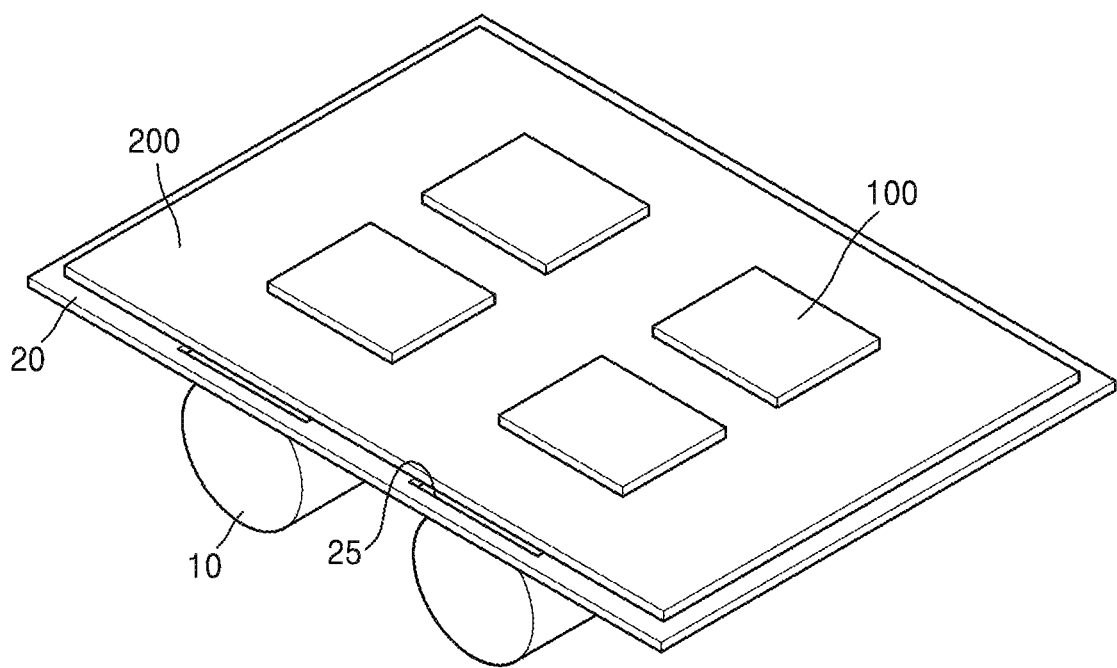
FIG. 19 is a perspective view showing preparing of a flexible printed circuit board according to an exemplary embodiment of the inventive concept.

Selectively, the lower cavity 20 may include a hole providing vacuum (not shown) for fixing the flexible PCB (200 of FIG. 19) and may have a heating function for transferring heat to the flexible PCB (200 of FIG. 19).

FIG. 19 is a perspective view of the flexible PCB 200 according to the exemplary embodiment of the inventive concept.

Referring to FIG. 19, the flexible PCB 200 to which the semiconductor chip 100 is attached is mounted on the upper surface of the lower cavity 20. Here, the bending roller 10 is located under the lower cavity 20 so that the flexible PCB 200 maintains flat state. After that, the flexible PCB 200 may be heated so as to increase flexibility of the flexible PCB 200.

Figure 20:
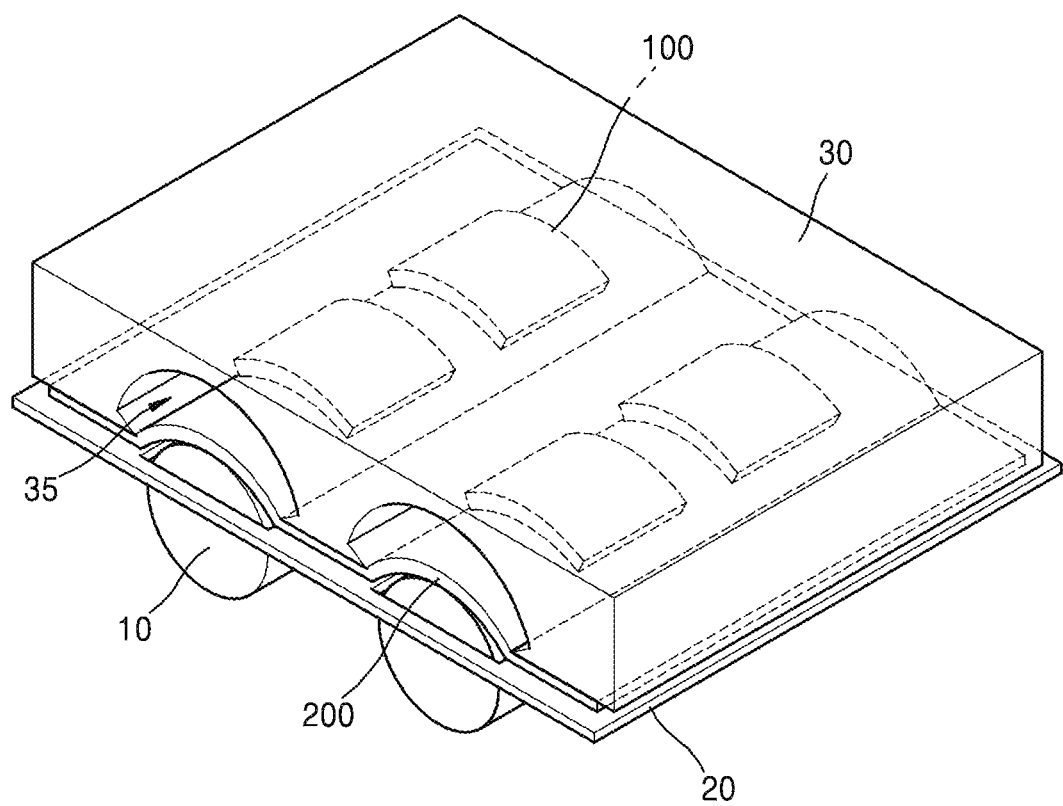
FIG. 20 is a perspective view illustrating a process of forming curve on a flexible printed circuit board according to an exemplary embodiment of the inventive concept.

FIG. 20 is a perspective view showing a process of curving the flexible PCB 200 according to the exemplary embodiment of the inventive concept.

Referring to FIG. 20, an upper cavity 30, also described as an upper plate, is placed on the flexible PCB 200 that is mounted on the lower cavity 20, or lower plate. After that, the bending roller 10 is elevated toward the figuration hole 25 of the lower cavity 20 while rotating.

The upper cavity 30 may include an accommodation space 35 for accommodating the curved portion of the flexible PCB 200. The accommodation space 35 accommodates the fixed bending portion 210 of the flexible PCB 200 shown in FIGS. 1 through 6, and may have a room to form the mold layer 300.

When the bending roller 10 elevates to the accommodation space 35 through the figuration hole 25 of the lower cavity 20, the flexible PCB 200 may have curved portions. While the bending roller 20 rotates to elevate, the flexible PCB 200 may be continuously heated to improve the flexibility.

When the flexible PCB 200 is curved, the semiconductor chip 100 may be curved together with the flexible PCB 200.

Figure 21:
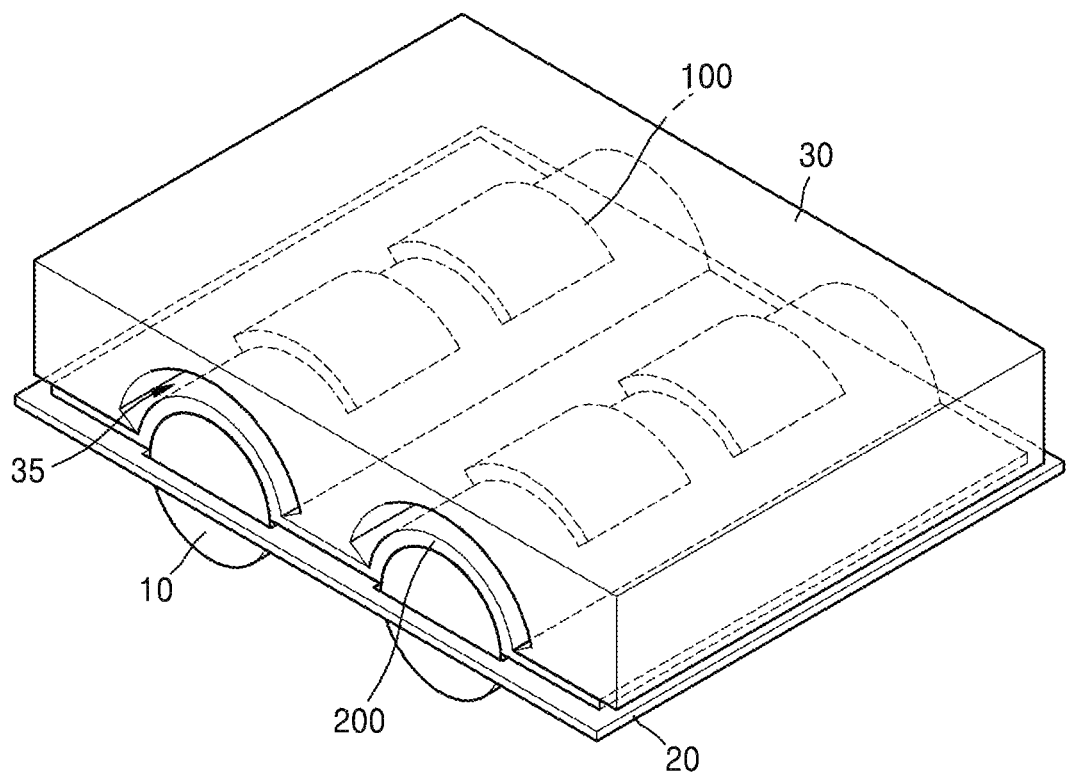
FIG. 21 is a perspective view of a curve formed on a flexible printed circuit board according to an exemplary embodiment of the inventive concept.

FIG. 21 is a perspective view showing the flexible PCB 200 having curved portions, according to the exemplary embodiment of the inventive concept.

Referring to FIG. 21, the bending roller 10 is elevated until a space that is used for forming the mold layer (300 of FIG. 1) in a state where the semiconductor chip 100 does not contact the upper cavity 30 remains in the accommodation space 35. After that, the elevation of the bending roller 10 is terminated. If the flexible PCB 200 is heated while being curved, a cooling process may be performed to reduce the flexibility of the flexible PCB 200.

Figure 22:
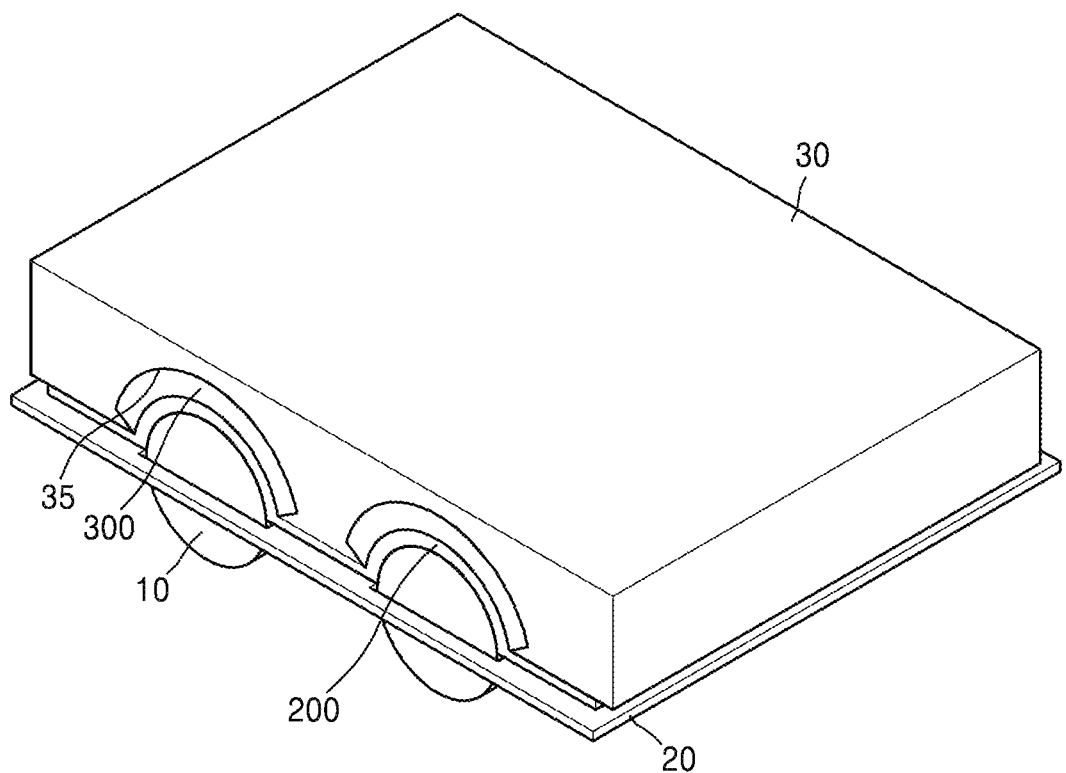
FIG. 22 is a cross-sectional view showing a process of forming a mold layer according to an exemplary embodiment of the inventive concept.

FIG. 22 is a cross-sectional view illustrating a process of forming the mold layer 300 according to the exemplary embodiment of the inventive concept.

Referring to FIG. 22, in one embodiment, a molding material is injected between the upper cavity 303 and the flexible PCB 200 to form the mold layer 300. The mold layer 300 may be formed of a rigid material. The mold layer 300 may be formed of, for example, an epoxy molding compound (EMC).

The curved portions of the flexible PCB 200 are fixed by the mold layer 300 so as to form the fixed bending portion 210, the deformation of which is restricted. The remaining portion of the flexible PCB 200, which is not covered by the mold layer 300, may be the flexible portion 220 that is freely transformed.

In FIG. 22, the mold layer 300 mostly covers the curved portions of the flexible PCB 200, but is not limited thereto. For example, like the semiconductor package 1b shown in FIG. 2, if the flexible portion 220a extends along the arc continued from the fixed bending portion 210, the accommodation space 35 of the upper cavity 30 may be formed to be deeper than that of FIG. 22 so that the flexible PCB 200 may have a more curved portion, and then, the mold layer 300 may cover only a part of the curved portion of the flexible PCB 200.

Figure 23:
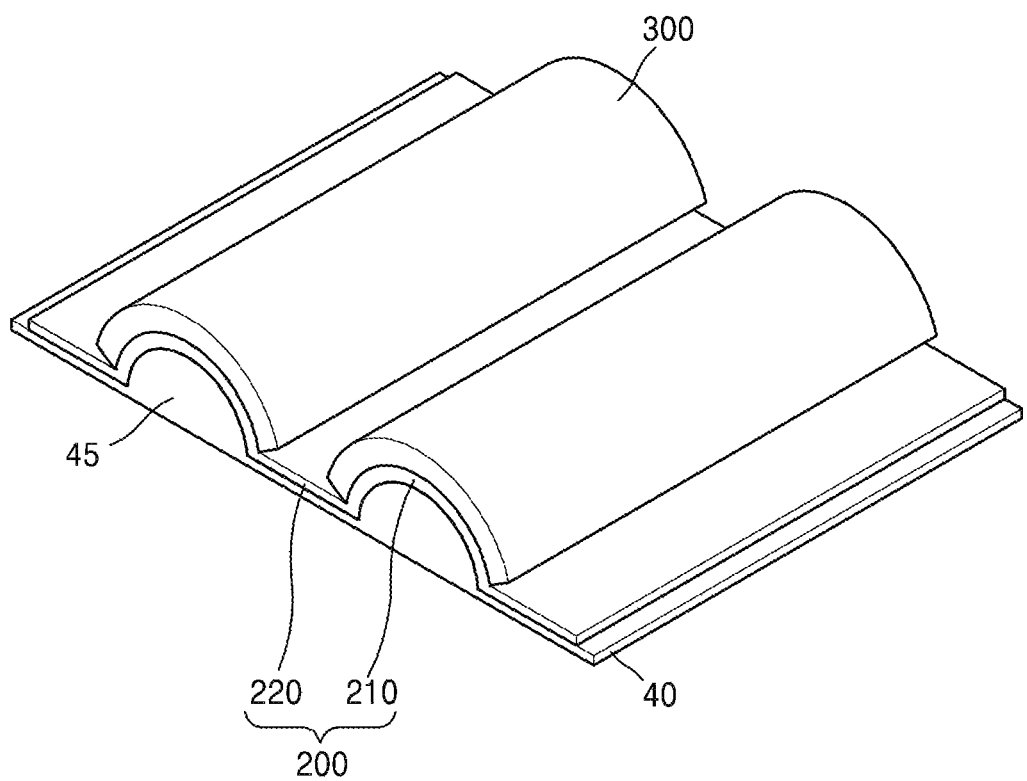
FIG. 23 is a perspective view showing a process of preparing a frame carrier according to an exemplary embodiment of the inventive concept.

FIG. 23 is a perspective view showing a process of preparing a frame carrier 40 according to the exemplary embodiment of the inventive concept.

Referring to FIG. 23, the flexible PCB 200, in which the mold layer 300 is formed on the fixed bending portion 210, is moved onto the frame carrier 40 for performing a post-process with respect to the flexible PCB 200. The frame carrier 40 may have a protrusion 45 that may support the curved portion of the flexible PCB 200. An upper surface of the frame carrier 40 having the protrusion 45 may have a shape corresponding to the lower surface of the flexible PCB 200.

Figure 24:
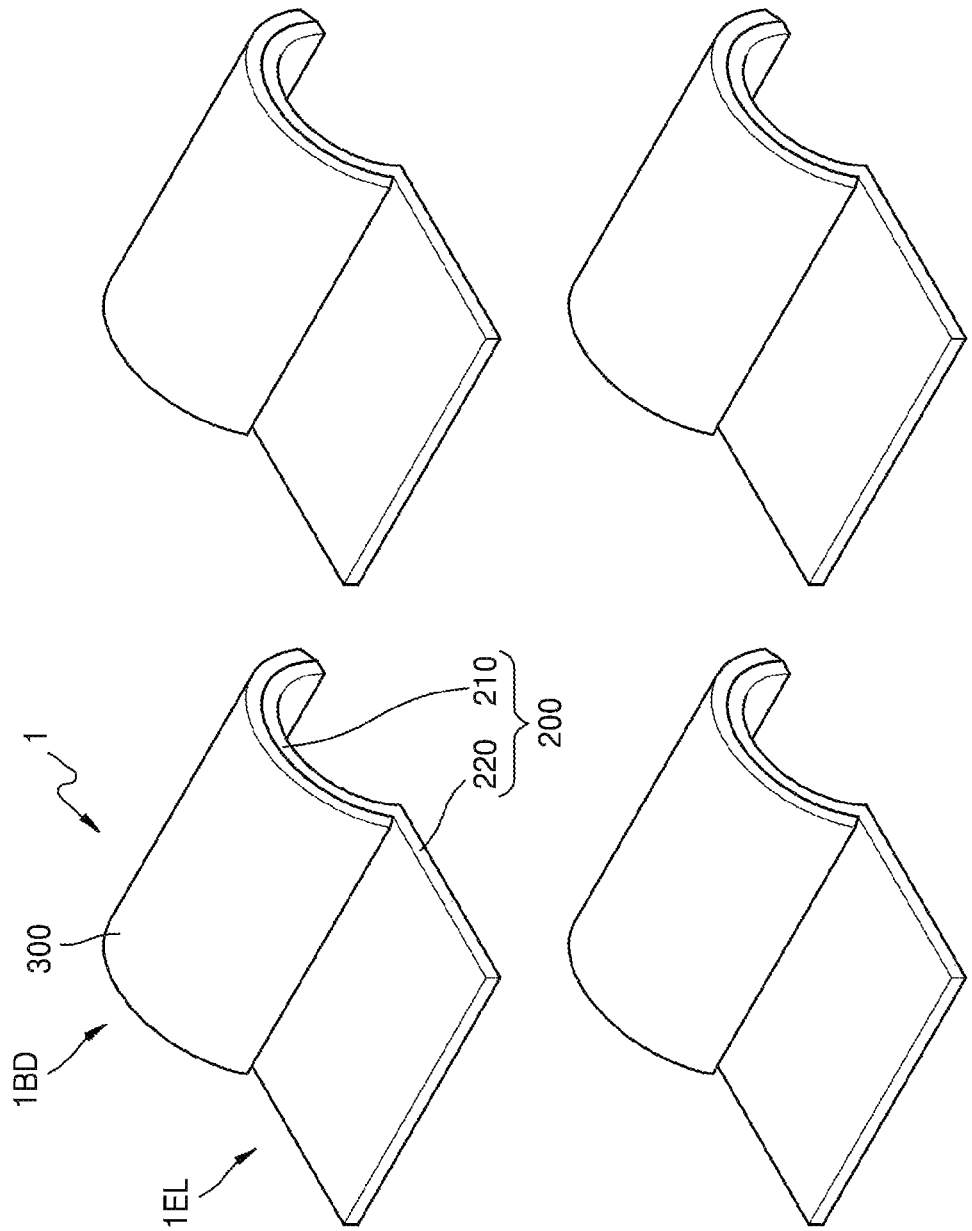
FIG. 24 is a perspective view showing a process of manufacturing a semiconductor package according to an exemplary embodiment of the inventive concept.

FIG. 24 is a perspective view illustrating a process of forming the semiconductor package according to an exemplary embodiment of the inventive concept.

Referring to FIGS. 23 and 24, if the flexible PCB 200 is a panelling PCB for forming a plurality of semiconductor packages 1 at the same time, a singulation process for isolating the semiconductor packages 1 by cutting the PCB is performed. During the singulation process, the shape of the flexible portion 220 may be processed to form the semiconductor packages 1a, 1b, 1c, and 1d shown in FIGS. 2 through 5.

The external connection portion 260 shown in FIG. 1 or the additional connection portion 262 shown in FIG. 4 may be formed before or after performing the singulation process for isolating the semiconductor packages 1. The additional semiconductor chip 190 shown in FIG. 5 may be attached to the flexible PCB 200 when the semiconductor chips 1 are attached to the flexible PCB 200, or may be attached to the flexible PCB 200 before the singulation process. In one embodiment, if the semiconductor package 1e shown in FIG. 6 is formed, the EMI shield layer 350 may be performed before the singulation process.

Figure 25:
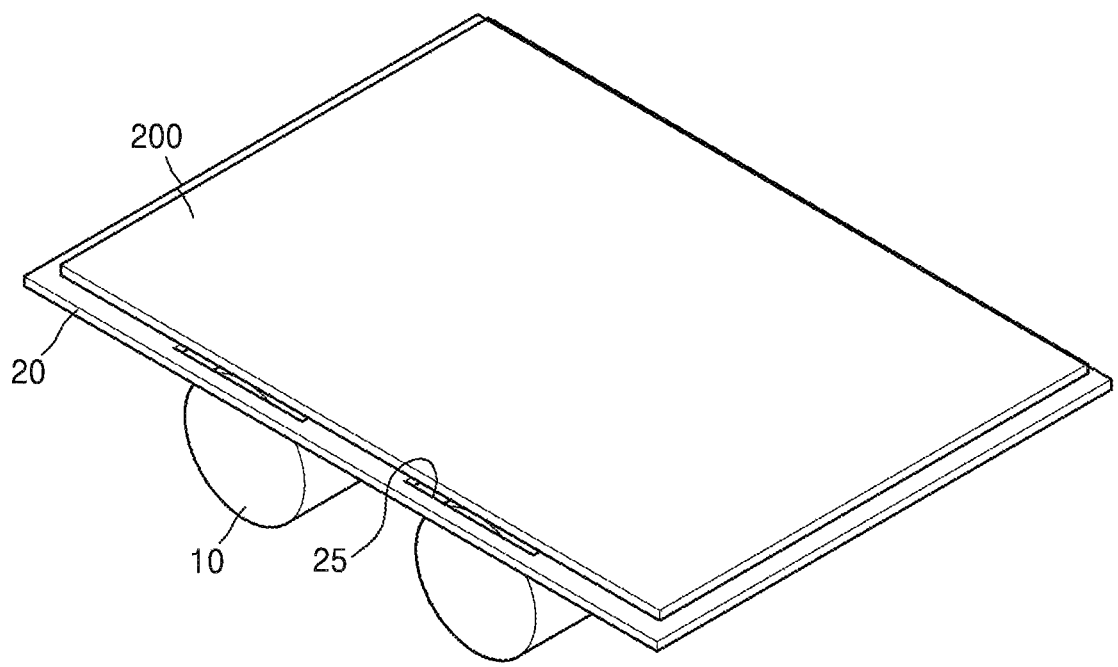
FIG. 25 is a perspective view showing a process of preparing a flexible printed circuit board according to an exemplary embodiment of the inventive concept.
Figure 26:
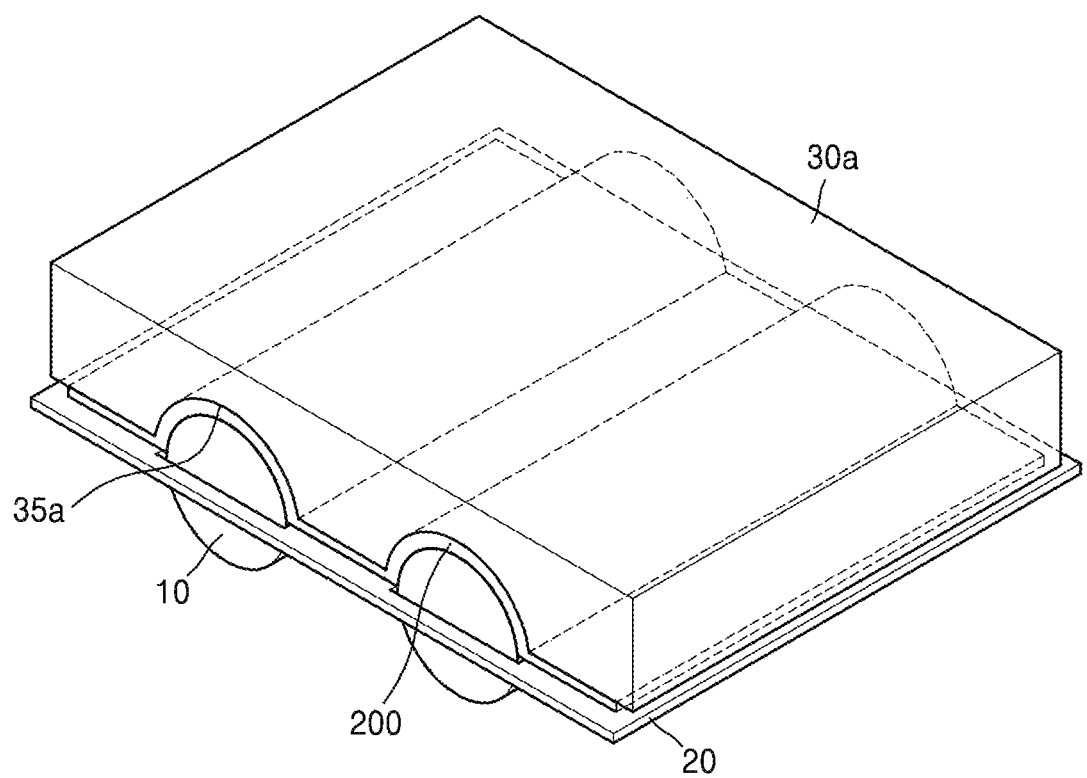
FIG. 26 is a perspective view showing a process of forming a curve on a flexible printed circuit board according to an exemplary embodiment of the inventive concept.
Figure 27:
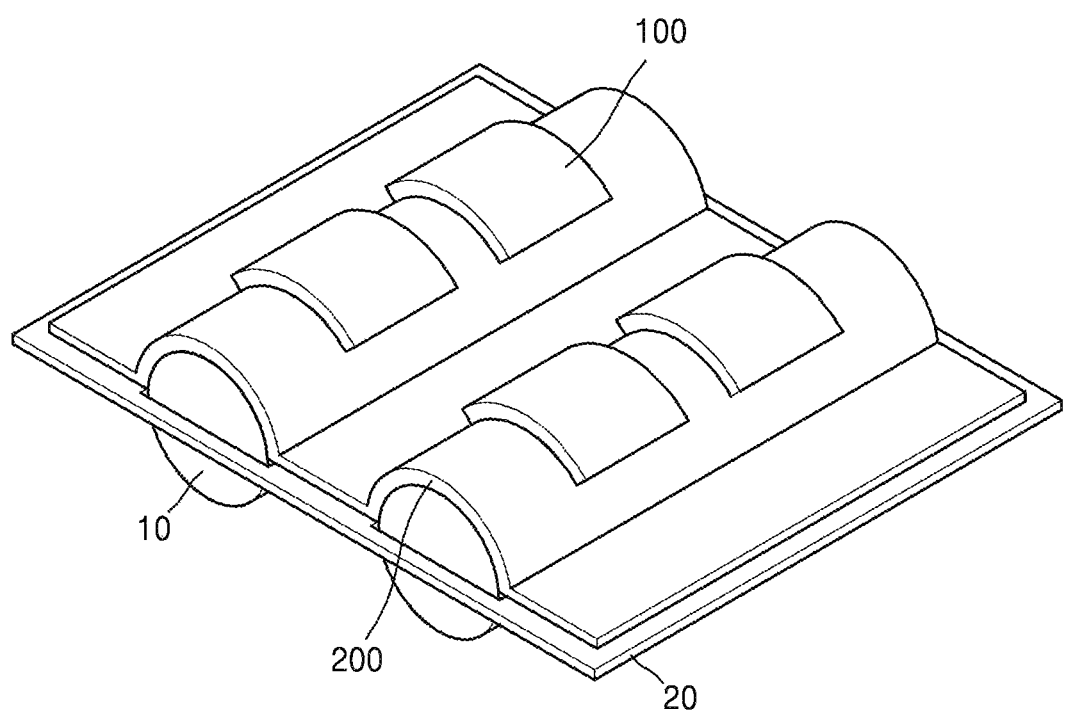
FIG. 27 is a perspective view showing a process of attaching a semiconductor chip onto a flexible printed circuit board according to an exemplary embodiment of the inventive concept.

FIGS. 25 through 27 are perspective views illustrating a method of manufacturing a semiconductor package according to an exemplary embodiment of the inventive concept. Like reference numerals to those of FIGS. 18 through 24 denote the same elements, and detailed descriptions thereof may be omitted.

FIG. 25 is a perspective view illustrating a process of preparing the flexible PCB 200 according to the exemplary embodiment of the inventive concept.

Referring to FIG. 25, the flexible PCB 200 is placed on the upper surface of the lower cavity 20. Here, the bending roller 10 is located under the lower cavity 20 so that the flexible PCB 200 maintains a flat state. After that, the flexible PCB 200 may be heated to increase the flexibility of the flexible PCB 200.

Unlike the flexible PCB 200 of FIG. 19, the semiconductor chips are not attached to the flexible PCB 200 of FIG. 25.

FIG. 26 is a perspective view illustrating a process of curving the flexible PCB 200 according to the exemplary embodiment of the inventive concept.

Referring to FIG. 26, an upper support member 30*a* is placed on the flexible PCB 200 that is placed on the lower cavity 20. After that, the bending roller 10 is elevated toward the figuration hole 25 of the lower cavity 20. The bending roller 10 may be rotated while being elevated.

The upper support member 30*a* may include an accommodation space 35*a* for accommodating the curved portion of the flexible PCB 200. An inner surface of the accommodation space 35*a* may have a shape corresponding to the second surface 204 of the fixed bending portion 210 of the flexible PCB 200 shown in FIGS. 1 through 6.

When the bending roller 10 elevates to the accommodation space 35*a* after passing through the figuration hole 25 of the lower cavity 20, the flexible PCB 200 is curved. While the bending roller 10 rotates to elevate, the flexible PCB 200 may be continuously heated in order to increase the flexibility.

After that, the elevation of the bending roller 10 is terminated. If the flexible PCB 200 is heated during the process of curving the flexible PCB 200, a cooling process is performed to reduce the flexibility of the flexible PCB 200.

FIG. 27 is a perspective view illustrating a process of attaching the semiconductor chips onto the flexible PCB 200, according to one exemplary embodiment of the inventive concept.

Referring to FIG. 27, after removing the upper support member 30*a* shown in FIG. 26, the semiconductor chips 100 are attached to the curved portion of the flexible PCB 200. If a back-lap process is performed with respect to a semiconductor wafer including the plurality of semiconductor chips 100 to form thin semiconductor chips 100, the semiconductor chip 100 isolated from the semiconductor wafer may be warped. The semiconductor chips 100 may be attached to the curved portion of the flexible PCB 200 by using the warpage of the semiconductor chips 100. As such, one exemplary manufacturing method includes using previously warped chips, and placing them on a curved portion of a flexible PCB 200 curved using a device such as shown in FIG. 27.

In FIG. 27, the semiconductor chips 100 are attached to the flexible PCB 200 in a state where the flexible PCB 200 is placed on the lower cavity 20, but the inventive concept is not limited thereto. That is, the semiconductor chips 100 may be attached to the flexible PCB 200 after placing the flexible PCB 200 on the frame carrier 40 shown in FIG. 23.

Then, the processes illustrated in FIGS. 22 through 24 are performed to form the semiconductor package 1.

Figure 28:
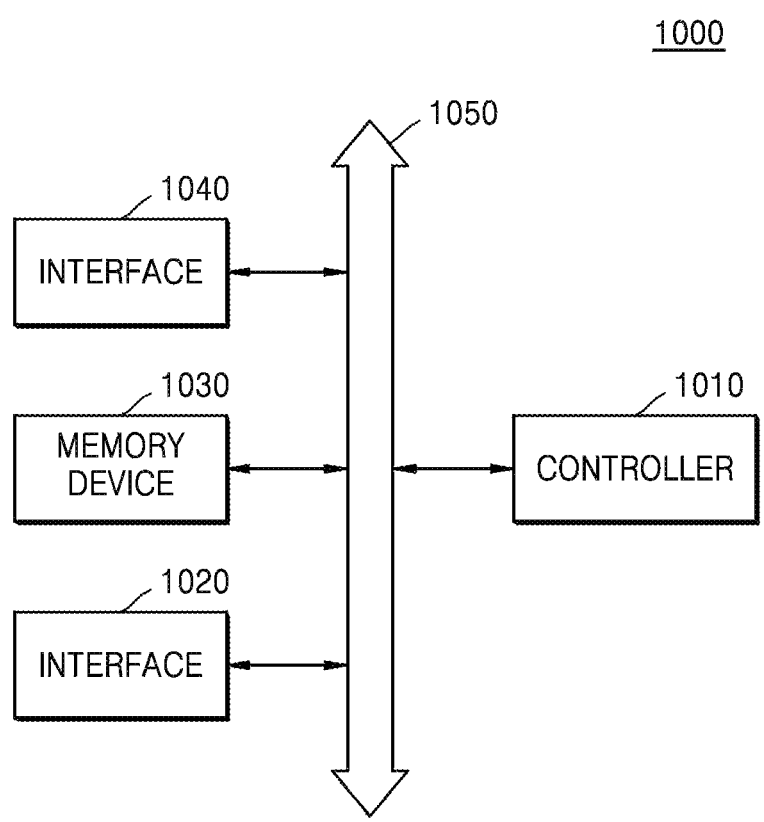
FIG. 28 is a block diagram of a system including a semiconductor package according to an exemplary embodiment of the inventive concept.

FIG. 28 is a block diagram of a system 1000 including the semiconductor package according to an exemplary embodiment of the inventive concept.

Referring to FIG. 28, the system 1000 includes a controller 1010, an input/output device 1020, a memory device 1030, and an interface 1040. The system 100 may be a mobile system or a system for transferring or receiving information. In some embodiments, the mobile system may be an electronic device such as a personal digital assistant (PDA), a portable computer, a web tablet, a wireless phone, a mobile phone, a digital music player, or a memory card. The controller 1010 controls execution programs in the system 1000, and may be a microprocessor, a digital signal processor, a microcontroller, or a similar device. The input/output device 1020 may be used to input or output data to or from the system 1000. The system 1000 may be connected to an external device, for example, a personal computer or a network, by using the input/output device 1020, and may exchange data with the external device. The input/output device 1020 may be, for example, a keypad, a keyboard, or a display.

The memory device 1030 stores codes and/or data for operating the controller 1010, or stored data processed by the controller 1010. The memory device 1030 may include the semiconductor package according to the embodiments of the inventive concept. For example, the memory device 1030 may include one of the semiconductor packages 1, 1*a*, 1*b*, 1*c*, 1*d*, and 1*e* described above with reference to FIGS. 1 through 27.

The interface 1040 may be a data transmission path between the system 1000 and another external device. The controller 1010, the input/output device 1020, the memory device 1030, and the interface 1040 may communicate with each other via a bus 1050. The system 1000 may be used in a mobile phone, an MP3 player, a navigation system, a portable multimedia player (PMP), a solid state disk (SSD), or household appliances.

Figure 29:
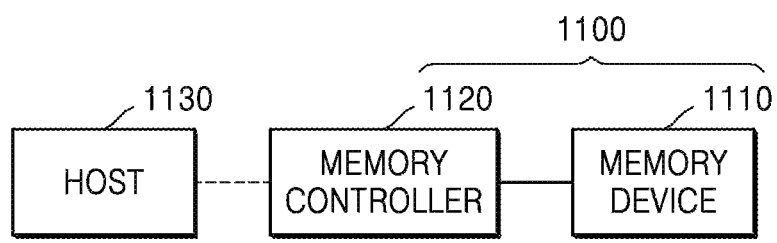
FIG. 29 is a block diagram of a memory card including a semiconductor package according to an exemplary embodiment of the inventive concept.

FIG. 29 is a block diagram of a memory card 1100 including the semiconductor package according to the exemplary embodiment of the inventive concept.

Referring to FIG. 29, the memory card 1100 includes a memory device 1110 and a memory controller 1120.

The memory device 1110 may store data. In some embodiments, the memory device 1110 may have a non-volatile property so as to maintain the stored data even when the power supply is terminated. The memory device 1110 may include the semiconductor package according to the exemplary embodiments of the inventive concept. For example, the memory device 1110 may include one of the semiconductor packages 1, 1*a*, 1*b*, 1*c*, 1*d*, and 1*e* described with reference to FIGS. 1 through 27.

The memory controller 1120 may read the data stored in the memory device 1110 or may store data in the memory device 1110 in response to a read/write request from a host 1130.

Figure 30:
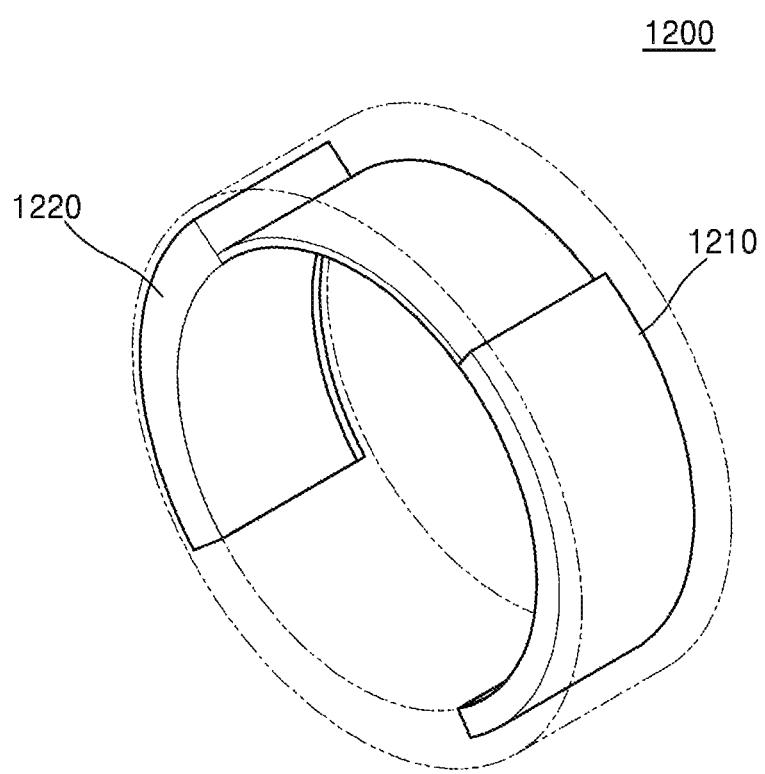
FIG. 30 is a schematic perspective view of an electronic device to which a semiconductor package is applied according to an exemplary embodiment of the inventive concept.

FIG. 30 is a schematic perspective view of an electronic device to which the semiconductor package according to the exemplary embodiment of the inventive concept may be applied.

FIG. 30 shows an example of an electronic device formed of the system 1000 of FIG. 28. For example, the electronic device 1200 may have an outer appearance including curves. For example, the electronic device 1200 may be formed as a ring shape. The electronic device 1200 may include a semiconductor package 1210 and a system block 1220. It may have a curved (e.g., arc-shaped, or ring shaped) outer housing within which the semiconductor package 1210 and system block 1220 are disposed. The semiconductor package 1210 may include one of the semiconductor packages 1, 1*a*, 1*b*, 1*c*, 1*d*, and 1*e* described with reference to FIGS. 1 through 27. The semiconductor package 1210 may be provided in the electronic device 1200 so that the arch-shaped portion of the semiconductor package 1210, that is, the fixed bending portion 210 shown in FIGS. 1 through 6, or the main body 1BD or 1BDe may correspond to the curved outer appearance of the electronic device 1200.

The system block 1220 may include a controller, a communication device, an input/output device, or an interface. Otherwise, some of the controller, the communication device, the input/output device, and the interface may be attached onto the semiconductor package 1210 as the additional semiconductor chips 190 shown in FIG. 5. The system block 1220 may be electrically connected to the semiconductor package 1210. The system block 1220 may be electrically connected to, for example, the flexible portion 220, 220a, 220b, 220c, 220d, or 220e shown in FIGS. 1 through 6.

Also, FIG. 30 shows the electronic device 1200 of a closed loop type, the embodiments of the inventive concept are not limited thereto. That is, the electronic device 1200 may be formed as an arc type having an opening. In certain embodiments, the electronic device 1200 may be a watch, or bracelet, wherein the system block 1220 and semiconductor package 1210 are part of the device, and addition electronic portions, such as a screen, or certain input elements such as buttons, may be included. The electronic device 1200 may also be, for example, a wearable ring to placed on one's finger, or another type of jewelry.

Figure 31:
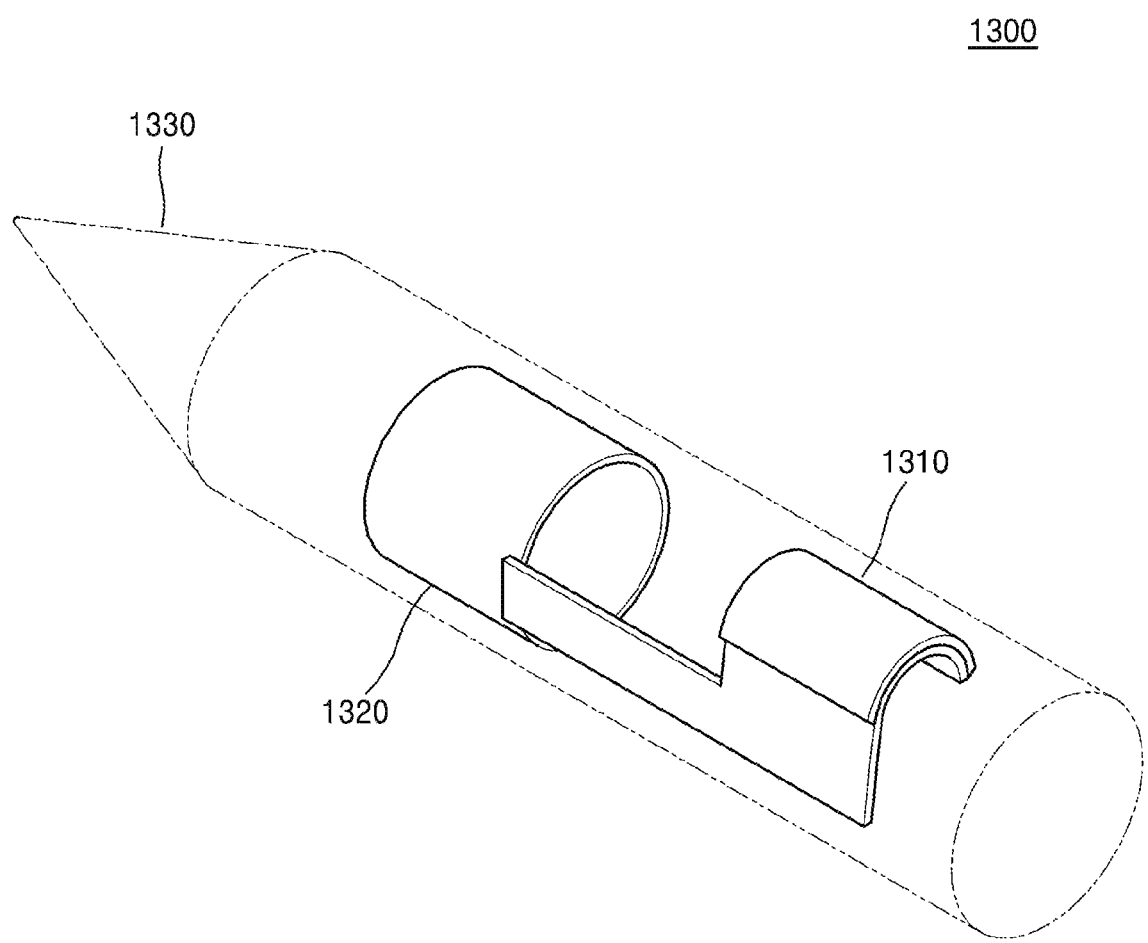
FIG. 31 is a schematic perspective view of an electronic device including a semiconductor package applied thereto according to an exemplary embodiment of the inventive concept.

FIG. 31 is a schematic perspective view of another electronic device 1300 formed of a semiconductor package according to the various embodiments of the inventive concept.

FIG. 31 shows an electronic device 1300 that includes, for example, the system 1000 of FIG. 28. For example, the electronic device 1300 may have a cylindrical shape, and may be in the form of a pen-type device. The electronic device 1300 may include a semiconductor package 1310 and a system block 1320. The semiconductor package 1310 may include one of the semiconductor packages 1, 1a, 1b, 1c, 1d, and 1e described with reference to FIGS. 1 through 27.

The system block 1320 may include a controller, a communication device, an input/output device, or an interface. In one embodiment, some of the controller, the communication device, the input/output device, and the interface may be attached onto the semiconductor package 1310 as the additional semiconductor chips 190 shown in FIG. 5.

A pen, a laser beam, or a photosensitive device may be formed at an end 1310 of the pen type electronic device 1300, for example.

While various aspects of the inventive concept have been particularly shown and described with reference to exemplary embodiments thereof, it will be understood that various changes in form and details may be made therein without departing from the spirit and scope of the following claims.

What is claimed is:

1. An electronic device comprising:
    a flexible printed circuit board (PCB) of a semiconductor package, comprising a fixed bent portion in a fixed state and formed in an arch-shape and comprising a first concave surface and a second convex surface opposite to the first surface;
    at least one semiconductor chip attached to the second surface of the fixed bent portion of the flexible PCB and forming an arch-shape; and
    a mold layer having rigidity and formed on the second surface of the fixed bent portion of the flexible PCB while surrounding the at least one semiconductor chip.

2. The electronic device of claim 1, wherein the flexible PCB further comprises a flexible portion extending from the fixed bent portion, and at least a part of the flexible portion is not covered by the mold layer.

3. The electronic device of claim 2, wherein the flexible PCB is continually formed from the fixed bent portion to the flexible portion.

4. The electronic device of claim 2, wherein the flexible PCB comprises a base package substrate, a plurality of wiring lines, and a cover layer formed at the first surface and the second surface to cover at least a part of the plurality of wiring lines, and the cover layer covers the entire first surface of the fixed bending portion.

5. The electronic device of claim 4, wherein at least one of the plurality of wiring lines is not electrically connected to the at least one semiconductor chip.

6. The electronic device of claim 4, further comprising at least one additional semiconductor chip attached to the second surface of the flexible portion and electrically connected to at least one of the plurality of wiring lines.

7. The electronic device of claim 4, wherein the flexible PCB further comprises an external connection portion formed on a first end of the flexible portion, which is farther from the fixed bent portion than is a second end of the flexible portion.

8. The electronic device of claim 1, wherein the mold layer causes the flexible PCB to be in the fixed state at the fixed bent portion.

9. The electronic device of claim 1, wherein the at least one semiconductor chip comprises a plurality of metal oxide semiconductor field effect transistor (MOSFET) devices, an active surface on which a plurality of word lines and a plurality of bit lines extending perpendicularly to each other to form the plurality of MOSFET devices are formed, and a non-active surface opposite to the active surface, and the at least one semiconductor chip is attached to the fixed bent portion so that the non-active surface of the at least one semiconductor chip faces the second surface.

10. The electronic device of claim 9, wherein the plurality of MOSFET devices are n-type MOSFET devices, and the plurality of bit lines extend along an arc direction, in which the fixed bent portion extends.

11. The electronic device of claim 9, wherein the plurality of MOSFET devices are p-type MOSFET devices, and the plurality of word lines extend along an arc direction, in which the fixed bending portion extends.

12. The electronic device of claim 1, further comprising a curved outer housing in which the semiconductor package is disposed.

13. The electronic device of claim 1, wherein:
    the first surface of the first fixed bent portion of the flexible PCB extends along an arc, and faces a center of curvature to have a first radius of curvature; and
    an upper surface of the mold layer extends along an arc having a second radius of curvature, and a center of curvature of the arc having the second radius of curvature is farther from the fixed bent portion than is a center of curvature of the arc having the first radius of curvature.

14. A semiconductor package comprising:
    a flexible printed circuit board (PCB) comprising a fixed bent portion formed as an arch-shape extending along an arc having a first radius of curvature, a flexible portion extending from the fixed bending portion, and a first surface facing a center of curvature and a second surface opposite to the first surface;
    at least one semiconductor chip attached to the second surface of the fixed bent portion of the flexible PCB, and formed as an arch-shape extending along the arc having the first radius of curvature; and
    a mold layer having rigidity and covering the entire second surface of the fixed bent portion of the flexible PCB while surrounding the at least one semiconductor chip.

15. The semiconductor package of claim 14, wherein an upper surface of the mold layer extends along an arc having a second radius of curvature, and a center of curvature of the arc having the second radius of curvature is farther from the fixed bent portion than is a center of curvature of the arc having the first radius of curvature.

16. The semiconductor package of claim 14, wherein an upper surface of the mold layer extends along an arc having a second radius of curvature that is less than the first radius of curvature.

17. The semiconductor package of claim 16, wherein a plurality of the semiconductor chips are sequentially stacked, and an uppermost semiconductor chip from among the plurality of semiconductor chips has an area that is less than an area of another semiconductor chip located under the uppermost semiconductor chip.

18. The semiconductor package of claim 14, wherein the at least one semiconductor chip comprises a plurality of metal oxide semiconductor field effect transistor (MOSFET) devices, and mobility in the plurality of MOSFET devices when the at least one semiconductor chip is arch-shaped is greater than mobility in the plurality of MOSFET devices when the at least one semiconductor chip is flat.

19. The semiconductor package of claim 14, wherein the flexible PCB further comprises:
   an insulating cover layer covering the entire surface of the fixed bent portion; and
   an external connection portion formed on the flexible portion.

20. An electronic device having an outer appearance including a curved surface, the electronic device comprising:
   a semiconductor package comprising:
      a flexible printed circuit board (PCB) comprising a fixed bent portion in a fixed state and formed in an arch-shape extending along an arc having a concave curvature facing a first direction, and a flexible portion extending from the fixed bent portion, the flexible PCB comprising a first surface facing the first direction and a second surface opposite to the first surface;
      at least one semiconductor chip attached to the second surface of the fixed bent portion of the flexible PCB; and
      a mold layer having rigidity and formed on the second surface of the fixed bent portion of the flexible PCB while surrounding the at least one semiconductor chip for restricting deformation of the fixed bent portion; and
   a system block connected to the flexible portion to be electrically connected to the semiconductor package,
   wherein the semiconductor package is provided in the electronic device so that the fixed bent portion corresponds to the outer appearance including the curved surface of the electronic device.

* * * * *